(12) United States Patent
Eipper et al.

(10) Patent No.: US 8,445,107 B2
(45) Date of Patent: May 21, 2013

(54) MULTICOMPONENT MOLDING WITH POLYESTER LAYERS

(75) Inventors: Andreas Eipper, Ludwigshafen (DE); Bernd Bruchmann, Freinsheim (DE); Carsten Weiss, Singapore (SG); Mark Voelkel, Ladenburg (DE); Bernhard Rosenau, Neustadt (DE); Christophe Ginss, Wolxheim (FR); Kurt Hofli, Ludwigshafen (DE)

(73) Assignee: BASF SE, Ludwigshafen (DE)

( * ) Notice: Subject to any disclaimer, the term of this patent is extended or adjusted under 35 U.S.C. 154(b) by 195 days.

(21) Appl. No.: 11/917,487

(22) PCT Filed: Jun. 13, 2006

(86) PCT No.: PCT/EP2006/063167
§ 371 (c)(1),
(2), (4) Date: Dec. 13, 2007

(87) PCT Pub. No.: WO2006/134115
PCT Pub. Date: Dec. 21, 2006

(65) Prior Publication Data
US 2008/0211135 A1   Sep. 4, 2008

(30) Foreign Application Priority Data
Jun. 14, 2005   (DE) .......................... 10 2005 027 549

(51) Int. Cl.
    *B32B 27/36*   (2006.01)
(52) U.S. Cl.
    USPC ........... 428/412; 428/480; 524/537; 524/604; 525/444; 525/466; 525/439
(58) Field of Classification Search
    USPC ................. 524/100, 126, 133, 147, 413, 423, 524/447, 537, 604; 525/444, 466, 250; 428/412, 428/480
    See application file for complete search history.

(56) References Cited

U.S. PATENT DOCUMENTS

| | | | |
|---|---|---|---|
| 3,305,605 A | 2/1967 | Hostettler et al. |
| 3,479,314 A | 11/1969 | Williams |
| 3,491,048 A | 1/1970 | Sargent |
| 4,002,581 A | 1/1977 | Dolce |
| 4,164,114 A | 8/1979 | Yabuki et al. |
| 4,239,677 A | 12/1980 | Dieck |
| 4,351,916 A | 9/1982 | Kohan |
| 4,396,742 A | 8/1983 | Binsack et al. |
| 4,771,109 A | 9/1988 | Eichenauer et al. |
| 4,873,289 A | 10/1989 | Linder et al. |
| 4,882,381 A | 11/1989 | Wittman et al. |
| 5,010,135 A | 4/1991 | Eckel et al. |
| 5,136,014 A | 8/1992 | Figuly |
| 5,144,005 A | 9/1992 | Sextro et al. |
| 5,157,076 A | 10/1992 | Greenlee et al. |
| 5,250,595 A | 10/1993 | Miyashita et al. |
| 5,314,949 A | 5/1994 | Kozakura et al. |
| 5,348,699 A | 9/1994 | Meyer et al. |
| 5,399,620 A | 3/1995 | Niessner et al. |
| 5,480,944 A | 1/1996 | Aharoni |
| 5,496,887 A | 3/1996 | Braune |
| 5,608,030 A | 3/1997 | Hoffmockel et al. |
| 5,621,031 A | 4/1997 | Leimann et al. |
| 5,712,336 A | 1/1998 | Gareiss et al. |
| 5,844,059 A | 12/1998 | Yamamoto et al. |
| 5,998,565 A | 12/1999 | de Brabander-van den Berg et al. |
| 6,037,444 A | 3/2000 | Rannard et al. |
| 6,087,449 A | 7/2000 | Tiefensee et al. |
| 6,225,404 B1 | 5/2001 | Sorensen et al. |
| 6,232,435 B1 | 5/2001 | Heitz et al. |
| 6,252,025 B1 | 6/2001 | Wang et al. |
| 6,262,185 B1 | 7/2001 | Heitz et al. |
| 6,300,424 B1 | 10/2001 | Frechet et al. |
| 6,319,576 B1 * | 11/2001 | Rule et al. ..................... 428/35.7 |
| 6,346,327 B1 * | 2/2002 | Mokerji ........................ 428/412 |
| 6,497,959 B1 | 12/2002 | Mhetar |
| 6,528,612 B1 | 3/2003 | Brenner et al. |
| 6,541,599 B1 | 4/2003 | Wang |
| 6,605,665 B1 * | 8/2003 | Fischer et al. ................ 524/504 |

(Continued)

FOREIGN PATENT DOCUMENTS

| | | |
|---|---|---|
| BE | 702357 | 2/1968 |
| BE | 720658 | 11/1969 |

(Continued)

OTHER PUBLICATIONS

Voit, B.; Journal of Polymer Science Part A: Polymer Chemistry, May 2005, vol. 43, p. 2679-2699.*
Stumbe, J.F.; Bruchmann, B.; Macromolecular Rapid Communications, 2004, vol. 25, p. 921-924.*
Bolton, D.H.; Wooley, K.L.; Macromolecules, 1997, vol. 30, p. 1890-1896.*
Jang, J.; Oh, J.H.; Moon, S.I.; Macromolecules, 2000, vol. 33, p. 1864-1870.*
S. Rannard, et al. "A Highly Selective, one-Pot Multiple-Addition Convergent Synthesis of Polycarbonate Dendrimers", J. Am. Chem. Soc. 2000, 122, 11729-11730.
D. Bolton, et al., "Synthesis and Characterization of Hyperbranched Polycarbonates", *Macromolecules* 1997, 30, 1890-1896.
Massa, et al., "Novel Blends of Hyperbranched Polyesters and Linear polymers", *Macromolecules* (1995), pp. 3214-3220, vol. 28, No. 9.

(Continued)

*Primary Examiner* — Robert Jones, Jr.
(74) *Attorney, Agent, or Firm* — Novak Druce Connolly Bove + Quigg LLP

(57) ABSTRACT

Process for production of multicomponent moldings, which comprises producing a molding of which at least one layer is composed of a thermoplastic molding composition composed of
A) from 10 to 99.99% by weight of at least one thermoplastic polyester,
B) from 0.01 to 50% by weight of
B1) at least one highly branched or hyperbranched polycarbonate having an OH number of from 1 to 600 mg KOH/g of polycarbonate (to DIN 53240, Part 2), or
B2) at least one highly branched or hyperbranched polyester of $A_xB_y$ type, where x is at least 1.1 and y is at least 2.1, or a mixture of these, and
C) from 0 to 60% by weight of other additives,
where the total of the percentages by weight of components A) to C) is 100%.

18 Claims, No Drawings

U.S. PATENT DOCUMENTS

| | | | |
|---|---|---|---|
| 6,894,112 B1 | 5/2005 | Weber et al. | |
| 7,081,509 B2 * | 7/2006 | Wagner et al. | 528/272 |
| 2002/0120076 A1 | 8/2002 | Schueler et al. | |
| 2002/0161113 A1 | 10/2002 | Dvornic et al. | |
| 2003/0018104 A1 | 1/2003 | Mours et al. | |
| 2003/0069370 A1* | 4/2003 | Dvornic et al. | 525/474 |
| 2003/0082384 A1 | 5/2003 | Mhetar | |
| 2003/0171503 A1 | 9/2003 | Adedeji | |
| 2004/0138388 A1 | 7/2004 | Pecorini et al. | |
| 2004/0192857 A1 | 9/2004 | Borer et al. | |
| 2004/0220374 A1 | 11/2004 | Heuer et al. | |
| 2005/0054812 A1 | 3/2005 | Wagner et al. | |
| 2005/0124779 A1 | 6/2005 | Shelby et al. | |
| 2005/0165177 A1 | 7/2005 | Wagner et al. | |
| 2006/0142442 A1 | 6/2006 | Scherzer et al. | |
| 2007/0037957 A1* | 2/2007 | Bruchmann et al. | 528/196 |
| 2007/0173617 A1* | 7/2007 | Eipper et al. | 525/444 |
| 2007/0244227 A1* | 10/2007 | Eipper et al. | 523/400 |
| 2008/0015303 A1 | 1/2008 | Eibeck et al. | |
| 2008/0194741 A1* | 8/2008 | Engelmann et al. | 524/100 |
| 2009/0030140 A1* | 1/2009 | Eipper et al. | 524/537 |

FOREIGN PATENT DOCUMENTS

| | | |
|---|---|---|
| CA | 2019904 | 1/1991 |
| CA | 733567 | 5/1996 |
| CA | 2256343 | 12/1997 |
| CA | 2554037 | 8/2005 |
| CA | 2554038 | 8/2005 |
| DE | 55319 | 2/1891 |
| DE | 55320 | 2/1891 |
| DE | 222868 | 6/1910 |
| DE | 3725576 | 2/1989 |
| DE | 3800603 | 7/1989 |
| DE | 4307392 | 4/1994 |
| DE | 4328004 | 2/1995 |
| DE | 19953950 | 5/2001 |
| DE | 10132928 | 1/2003 |
| DE | 10136911 | 2/2003 |
| DE | 10147712 | 4/2003 |
| DE | 10163163 | 7/2003 |
| DE | 10240817 | 3/2004 |
| DE | 10251294 | 5/2004 |
| DE | 10304341 | 8/2004 |
| DE | 102004005652 | 8/2005 |
| DE | 102004005657 | 8/2005 |
| DE | 102004057867 | 6/2006 |
| DE | 102005012482 | 9/2006 |
| EP | 0050265 | 4/1982 |
| EP | 0047529 | 6/1985 |
| EP | 0208187 | 1/1987 |
| EP | 0235690 | 9/1987 |
| EP | 0319290 | 6/1989 |
| EP | 0410301 | 1/1991 |
| EP | 0484737 | 5/1992 |
| EP | 0545184 | 6/1993 |
| EP | 0629644 | 12/1994 |
| EP | 0682057 | 11/1995 |
| EP | 0736571 | 10/1996 |
| EP | 1099727 | 5/2001 |
| EP | 1207172 | 5/2002 |
| EP | 1344794 | 9/2003 |
| EP | 1424360 | 6/2004 |
| EP | 1424362 | 6/2004 |
| EP | 07114384.6 | 2/2009 |
| FR | 2833603 | 6/2003 |
| FR | 2833604 | 6/2003 |
| FR | 2856693 | 12/2004 |
| GB | 1458561 | 12/1976 |
| GB | 1558308 | 12/1979 |
| GB | 2324797 | 11/1998 |
| JP | 4175366 | 6/1992 |
| JP | 2006/100758 | 9/1992 |
| JP | 06157880 | 11/1992 |
| JP | 08269306 | 3/1995 |
| JP | 09157503 | 12/1995 |
| JP | 11060663 | 3/1999 |
| JP | 11255853 | 9/1999 |
| JP | 11279245 | 10/1999 |
| SU | 519449 | 6/1976 |
| WO | WO-96/11962 | 4/1996 |
| WO | WO-97/05705 | 2/1997 |
| WO | WO-97/08241 | 3/1997 |
| WO | WO 96/19537 * | 6/1997 |
| WO | WO-97/45474 | 12/1997 |
| WO | WO-98/50453 | 11/1998 |
| WO | WO-02/32982 | 4/2002 |
| WO | WO-03/004546 | 1/2003 |
| WO | WO03/054204 * | 6/2003 |
| WO | WO-03/064502 | 8/2003 |
| WO | WO-03/093343 | 11/2003 |
| WO | WO-2004/087785 | 10/2004 |
| WO | WO-2004/111126 | 12/2004 |
| WO | WO-2005/012380 | 2/2005 |
| WO | WO2005/026234 * | 3/2005 |
| WO | WO-2005/58385 | 6/2005 |
| WO | WO-2005/075563 | 8/2005 |
| WO | WO-2005/075565 | 8/2005 |
| WO | WO2005075563 * | 8/2005 |
| WO | WO2005075565 * | 8/2005 |
| WO | WO-2006/018127 | 2/2006 |
| WO | WO-2006/018128 | 2/2006 |
| WO | WO-2006/018179 | 2/2006 |
| WO | WO2006018127 * | 2/2006 |
| WO | WO2006/040066 * | 4/2006 |
| WO | WO-2006/040066 | 4/2006 |
| WO | WO-2006/040101 | 4/2006 |
| WO | WO-2006/042673 | 4/2006 |
| WO | WO-2006/048247 | 5/2006 |
| WO | WO-2006/082201 | 8/2006 |
| WO | WO-2007/009929 | 1/2007 |
| WO | WO-2007/009930 | 1/2007 |
| WO | WO-2008/074687 | 6/2008 |

OTHER PUBLICATIONS

Gorda, et al., "Star Shaped Condensation Polymers: Synthesis, Characterization, and Blend Properties", Journal of Applied Polymer Science (1993), pp. 1977-1983, vol. 50.

Sunder, et al., "Synthesis and Thermal Behaviour of Esterfied Alipghatic Hyperbranched Polyether Polyols", *Macromolecules* (2000), pp. 1330-1337, vol. 33.

Jang, Jyongsik, et al., "Crystallization Behaviour of Poly (ethylene terephthalate) Blended with Hyperbranched Polmers: The Effect of Terminal Groups and Composition of Hyperbranched Polymers". *Macromolecules*, 2000, 33, 1864-1870, XP-001079109.

P. Carr, et al., "Dielectric and mechanical characterization of aryl ester dendrimer/PET blends", Polymer, vol. 37, No. 12, 1996, pp. 2395-2401.

Lin, et al., "Polymerization of $A_2$ with $B_3$ Monomers: A Facile Approach to Hyperbranched Poly(aryl ester)s", *Macromolecules*, No. 36, 2003, pp. 9809-9816.

Luman, et al., "The Convergent Synthesis of Poly(glycerol-succinic acid) Dendritic macromolecules", Chem. Eur. J., No. 9, 2003, pp. 5618-5626.

Dr. S. Anders, et al., "Polycarbonate Polyacetale Polyester Celluloseester", Carl Hanser Verlag, 1992, pp. 118-119.

International Preliminary Report on Patentability for International Application No. PCT/EP2006/064182, issued Jan. 22, 2008.

International Preliminary Report on Patentability for International Application No. PCT/EP2006/064182, issued Feb. 5, 2008.

International Preliminary Report on Patentability for International Application No. PCT/EP2006/064180, issued Feb. 5, 2008.

International Preliminary Report on Patentability for International Application No. PCT/EP2006/064180, issued Jan. 22, 2008.

International Preliminary Report on Patentability for International Application No. PCT/EP2005/011704, issued May 22, 2007.

International Preliminary Report on Patentability for International Application No. PCT/EP2005/010854.

International Preliminary Report on Patentability for International Application No. PCT/EP2005/010854, issued Nov. 6, 2006.

International Preliminary Report on Patentability for International Application No. PCT/EP2006/042673.

International Preliminary Report on Patentability for International Application No. PCT/EP2005/001015.

International Preliminary Report on Patentability for International Application No. PCT/EP2005/001015, issued May 8, 2006.
International Preliminary Report on Patentability for International Application No. PCT/EP2006/050590, issued Aug. 14, 2007.
International Preliminary Report on Patentability for International Application No. PCT/EP2006/050590, issued Aug. 7, 2007.
International Preliminary Report on Patentability for International Application No. PCT/EP2005/010762, issued Apr. 24, 2007.
International Preliminary Report on Patentability for International Application No. PCT/EP2005/008339.
International Preliminary Report on Patentability for International Application No. PCT/EP2005/008339, issued Aug. 11, 2006.

K. Pochner et al., Treatment of polymers for subsequent metallization using intense UV radiation or plasma at atmospheric pressure, 1997, 372-377, Surface and Coatings Technology 97.
A. Weber et al., Metallization of Polymers Using Plasma-Enhanced Chemical Vapor Deposited Titanium Nitride as Interlayer, Mar. 1997, 1131-1135, Journal of The Electrochemical Society, vol. 14, No. 3.
H. Horn et al., Excimer laser pretreatment and metallization of polymers, 1999, 279-284, Nuclear Instrumentsand Methods in Physics Research B 151.
XP-002379462, Jun. 1992, Toray Ind., Inc.

* cited by examiner

MULTICOMPONENT MOLDING WITH POLYESTER LAYERS

CROSS REFERENCE TO RELATED APPLICATIONS

This application is a National Phase filing under 35 U.S.C. §371 of PCT/EP2006/063167, filed Jun. 13, 2006, which claims priority to German Patent Application No. 102005027549.4, filed Jun. 14, 2005. The entire contents of each of the above-applications are incorporated herein by reference.

The invention relates to an improved process for production of multicomponent moldings and to the resultant multicomponent moldings. Coating of polymers with metals is nowadays an important processing step for many applications. Not only decorative applications (packaging foils, gift foils, sanitary fittings, decorative coatings on casings, etc.) in the electronics sector (e.g. EMC screening, printed circuit board production, etc.) but also lighting systems (e.g. automobile headlamp reflectors, reflective parts in interior lighting units, etc.) require metallizing of polymer surfaces.

Processes based on chemistry and electroplating have hitherto been used for the metallizing of plastics. In these processes, the surface has to be pretreated via etching in chromic/sulfuric acid, but this is a complicated and polluting process (Kunststoffe 1999, 53, 3). In order to eliminate chromic/sulfuric acid, which is toxic, it is possible to metallize plastics by a physical method (via physical vapor deposition, PVD). In the case of polyesters, this physical process requires an expensive pretreatment via, for example, oxygen plasma, in order to achieve sufficient adhesion (Surface and Coatings Technology 1997, 372-377; J. Electrochemical Soc. 1997, 144, 3, 1131-1135; Nucl. Instr. Meth. Phys. Res. B 151 1999, 279-284).

A general problem with all moldings of multilayer structure is unsatisfactory adhesion of the layers when plastics layers are present in a composite with other materials (see, for example, U.S. Pat. No. 6,497,959).

It was therefore an object of the present invention to improve the adhesion of the layers of multicomponent moldings.

Accordingly, a process has been found for production of multicomponent moldings, and comprises producing a molding of which at least one layer is composed of a thermoplastic molding composition composed of
A) from 10 to 99.99% by weight of at least one thermoplastic polyester,
B) from 0.01 to 50% by weight of
B1) at least one highly branched or hyperbranched polycarbonate having an OH number of from 1 to 600 mg KOH/g of polycarbonate (to DIN 53240, Part 2), or
B2) at least one highly branched or hyperbranched polyester of $A_xB_y$ type, where x is at least 1.1 and y is at least 2.1, or a mixture of these, and
C) from 0 to 60% by weight of other additives,
where the total of the percentages by weight of components A) to C) is 100%.

The inventive molding compositions comprise, as component (A), from 10 to 99.99% by weight, preferably from 30 to 99.5% by weight, and in particular from 30 to 99.3% by weight, of at least one thermoplastic polyester other than B).

The polyesters A) generally used are those based on aromatic dicarboxylic acids and on an aliphatic or aromatic dihydroxy compound.

A first group of preferred polyesters is that of polyalkylene terephthalates, in particular those having from 2 to 10 carbon atoms in the alcohol moiety.

Polyalkylene terephthalates of this type are known per se and are described in the literature. Their main chain comprises an aromatic ring which derives from the aromatic dicarboxylic acid. There may also be substitution in the aromatic ring, e.g. by halogen, such as chlorine or bromine, or by $C_1$-$C_4$-alkyl, such as methyl, ethyl, iso- or n-propyl, or n-, iso- or tert-butyl.

These polyalkylene terephthalates may be prepared by reacting aromatic dicarboxylic acids, or their esters or other ester-forming derivatives, with aliphatic dihydroxy compounds in a manner known per se.

Preferred dicarboxylic acids are 2,6-naphthalenedicarboxylic acid, terephthalic acid and isophthalic acid, and mixtures of these. Up to 30 mol %, preferably not more than 10 mol %, of the aromatic dicarboxylic acids may be replaced by aliphatic or cycloaliphatic dicarboxylic acids, such as adipic acid, azelaic acid, sebacic acid, dodecanedioic acids and cyclohexanedicarboxylic acids.

Preferred aliphatic dihydroxy compounds are diols having from 2 to 6 carbon atoms, in particular 1,2-ethanediol, 1,3-propanediol, 1,4-butanediol, 1,6-hexanediol, 1,4-hexanediol, 1,4-cyclohexanediol, 1,4-cyclohexanedimethanol and neopentyl glycol, and mixtures of these.

Particularly preferred polyesters (A) are polyalkylene terephthalates derived from alkanediols having from 2 to 6 carbon atoms. Among these, particular preference is given to polyethylene terephthalate, polypropylene terephthalate and polybutylene terephthalate, and mixtures of these. Preference is also given to PET and/or PBT which comprise, as other monomer units, up to 1% by weight, preferably up to 0.75% by weight, of 1,6-hexanediol and/or 2-methyl-1,5-pentanediol.

The viscosity number of the polyesters (A) is generally in the range from 50 to 220, preferably from 80 to 160 (measured in 0.5% strength by weight solution in a phenol/o-dichlorobenzene mixture in a weight ratio of 1:1 at 25° C.) in accordance with ISO 1628.

Particular preference is given to polyesters whose carboxyl end group content is up to 100 meq/kg of polyester, preferably up to 50 meq/kg of polyester and in particular up to 40 meq/kg of polyester. Polyesters of this type may be prepared, for example, by the process of DE-A 44 01 055. The carboxyl end group content is usually determined by titration methods (e.g. potentiometry).

Particularly preferred molding compositions comprise, as component A), a mixture of polyesters other than PBT, for example polyethylene terephthalate (PET). The proportion of the polyethylene terephthalate, for example, in the mixture is preferably up to 50% by weight, in particular from 10 to 35% by weight, based on 100% by weight of A).

It is also advantageous to use recycled PET materials (also termed scrap PET), if appropriate mixed with polyalkylene terephthalates, such as PBT.

Recycled materials are generally:
1) those known as post-industrial recycled materials: these are production wastes during polycondensation or during processing, e.g. sprues from injection molding, start-up material from injection molding or extrusion, or edge trims from extruded sheets or foils.
2) post-consumer recycled materials: these are plastic items which are collected and treated after utilization by the end consumer. Blow-molded PET bottles for mineral water, soft drinks and juices are easily the predominant items in terms of quantity.

Both types of recycled material may be used either as ground material or in the form of pellets. In the latter case, the crude recycled materials are separated and purified and then melted and pelletized using an extruder. This usually facilitates handling and free flow, and metering for further steps in processing.

The recycled materials used may be either pelletized or in the form of regrind. The edge length should be not more than 10 mm, preferably less than 8 mm.

Because polyesters undergo hydrolytic cleavage during processing (due to traces of moisture) it is advisable to predry the recycled material. The residual moisture content after drying is preferably <0.2%, in particular <0.05%.

Another group to be mentioned is that of fully aromatic polyesters derived from aromatic dicarboxylic acids and aromatic dihydroxy compounds.

Suitable aromatic dicarboxylic acids are the compounds previously mentioned for the polyalkylene terephthalates. The mixtures preferably used are composed of from 5 to 100 mol % of isophthalic acid and from 0 to 95 mol % of terephthalic acid, in particular from about 50 to about 80% of terephthalic acid and from about 20 to about 50% of isophthalic acid.

The aromatic dihydroxy compounds preferably have the general formula

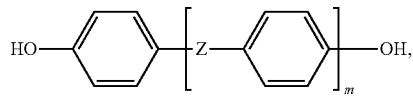

where Z is an alkylene or cycloalkylene group having up to 8 carbon atoms, an arylene group having up to 12 carbon atoms, a carbonyl group, a sulfonyl group, an oxygen or sulfur atom, or a chemical bond, and m is from 0 to 2. The phenylene groups of the compounds may also have substitution by $C_1$-$C_6$-alkyl or alkoxy and fluorine, chlorine or bromine.

Examples of parent compounds for these compounds are
dihydroxybiphenyl,
di(hydroxyphenyl)alkane,
di(hydroxyphenyl)cycloalkane,
di(hydroxyphenyl) sulfide,
di(hydroxyphenyl)ether,
di(hydroxyphenyl) ketone,
di(hydroxyphenyl) sulfoxide,
α,α'-di(hydroxyphenyl)dialkylbenzene,
di(hydroxyphenyl) sulfone, di(hydroxybenzoyl)benzene,
resorcinol, and
hydroquinone, and also the ring-alkylated and ring-halogenated derivatives of these.
Among these, preference is given to
4,4'-dihydroxybiphenyl,
2,4-di(4'-hydroxyphenyl)-2-methylbutane,
α,α'-di(4-hydroxyphenyl)-p-diisopropylbenzene,
2,2-di(3'-methyl-4'-hydroxyphenyl)propane, and
2,2-di(3'-chloro-4'-hydroxyphenyl)propane,
and in particular to
2,2-di(4'-hydroxyphenyl)propane
2,2-di(3',5-dichlorodihydroxyphenyl)propane,
1,1-di(4'-hydroxyphenyl)cyclohexane,
3,4'-dihydroxybenzophenone,
4,4'-dihydroxydiphenyl sulfone and
2,2-di(3',5'-dimethyl-4'-hydroxyphenyl)propane
and mixtures of these.

It is, of course, also possible to use mixtures of polyalkylene terephthalates and fully aromatic polyesters. These generally comprise from 20 to 98% by weight of the polyalkylene terephthalate and from 2 to 80% by weight of the fully aromatic polyester.

It is, of course, also possible to use polyester block copolymers, such as copolyetheresters. Products of this type are known per se and are described in the literature, e.g. in U.S. Pat. No. 3,651,014. Corresponding products are also available commercially, e.g. Hytrel® (DuPont).

According to the invention, polyesters include halogen-free polycarbonates. Examples of suitable halogen-free polycarbonates are those based on diphenols of the general formula

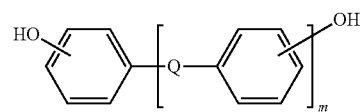

where Q is a single bond, a $C_1$-$C_8$-alkylene, $C_2$-$C_3$-alkylidene, $C_3$-$C_6$-cycloalkylidene, $C_6$-$C_{12}$-arylene group, or —O—, —S— or —SO$_2$—, and m is a whole number from 0 to 2.

The phenylene radicals of the diphenols may also have substituents, such as $C_1$-$C_6$-alkyl or $C_1$-$C_6$-alkoxy.

Examples of preferred diphenols of the formula are hydroquinone, resorcinol, 4,4'-di-hydroxybiphenyl, 2,2-bis(4-hydroxyphenyl)propane, 2,4-bis(4-hydroxyphenyl)-2-methyl-butane and 1,1-bis(4-hydroxyphenyl)cyclohexane. Particular preference is given to 2,2-bis(4-hydroxyphenyl)propane and 1,1-bis(4-hydroxyphenyl)cyclohexane, and also to 1,1-bis(4-hydroxyphenyl)-3,3,5-trimethylcyclohexane.

Either homopolycarbonates or copolycarbonates are suitable as component A, and preference is given to the copolycarbonates of bisphenol A, as well as to bisphenol A homopolymer.

Suitable polycarbonates may be branched in a known manner, preferably by incorporating from 0.05 to 2.0 mol %, based on the total of the diphenols used, of at least trifunctional compounds, for example those having three or more phenolic OH groups.

Polycarbonates which have proven particularly suitable have relative viscosities $\eta_{rel}$ of from 1.10 to 1.50, in particular from 1.25 to 1.40. This corresponds to an average molar mass $M_w$ (weight-average) of from 10 000 to 200 000 g/mol, preferably from 20 000 to 80 000 g/mol.

The diphenols of the general formula are known per se or can be prepared by known processes.

The polycarbonates may, for example, be prepared by reacting the diphenols with phosgene in the interfacial process, or with phosgene in the homogeneous-phase process (known as the pyridine process), and in each case the desired molecular weight may be achieved in a known manner by using an appropriate amount of known chain terminators. (In relation to polydiorganosiloxane-comprising polycarbonates see, for example, DE-A 33 34 782.)

Examples of suitable chain terminators are phenol, p-tert-butylphenol, or else long-chain alkylphenols, such as 4-(1,3-tetramethylbutyl)phenol, as in DE-A 28 42 005, or monoalkylphenols, or dialkylphenols with a total of from 8 to 20 carbon atoms in the alkyl substituents as in DE-A-35 06 472, such as p-nonylphenol, 3,5-di-tert-butylphenol, p-tert-octylphenol, p-dodecylphenol, 2-(3,5-dimethylheptyl)phenol and 4-(3,5-dimethyl-heptyl)phenol.

For the purposes of the present invention, halogen-free polycarbonates are poly-carbonates composed of halogen-free diphenols, of halogen-free chain terminators and, if appropriate, halogen-free branching agents, where the content of subordinate amounts at the ppm level of hydrolyzable chlorine, resulting, for example, from the preparation of the polycarbonates with phosgene in the interfacial process, is not regarded as meriting the term halogen-comprising for the purposes of the invention. Polycarbonates of this type with contents of hydrolyzable chlorine at the ppm level are halogen-free polycarbonates for the purposes of the present invention.

Other suitable components A) which may be mentioned are amorphous polyester carbonates, where during the preparation process phosgene has been replaced by aromatic dicarboxylic acid units, such as isophthalic acid and/or terephthalic acid units. Reference may be made at this point to EP-A 711 810 for further details. EP-A 365 916 describes other suitable copolycarbonates having cycloalkyl radicals as monomer units.

It is also possible for bisphenol A to be replaced by bisphenol TMC. Polycarbonates of this type are obtainable from Bayer with the trademark APEC HT®.

The inventive molding compositions comprise, as component B), from 0.01 to 50% by weight, preferably from 0.5 to 20% by weight, and in particular from 0.7 to 10% by weight, of B1) from at least one highly branched or hyperbranched polycarbonate, with an OH number of 1 to 600 mg KOH/g of polycarbonate, with preference from 10 to 550 mg KOH/g of polycarbonate, and in particular from 50 to 550 mg KOH/g of polycarbonate (to DIN 53240, Part 2), or of at least one hyperbranched polyester as component B2), or a mixture of these, as explained below.

For the purposes of this invention, hyperbranched polycarbonates B1) are non-crosslinked macromolecules having hydroxy groups and carbonate groups, these having both structural and molecular non-uniformity. Their structure may firstly be based on a central molecule in the same way as dendrimers, but with non-uniform chain length of the branches. Secondly, they may also have a linear structure with functional pendant groups, or else they may combine the two extremes, having linear and branched molecular portions. See also P. J. Flory, J. Am. Chem. Soc. 1952, 74, 2718, and H. Frey et al., Chem. Eur. J. 2000, 6, no. 14, 2499 for the definition of dendrimeric and hyperbranched polymers.

"Hyperbranched" in the context of the present invention means that the degree of branching (DB), i.e. the average number of dendritic linkages plus the average number of end groups per molecule, is from 10 to 99.9%, preferably from 20 to 99%, particularly preferably from 20 to 95%.

"Dendrimeric" in the context of the present invention means that the degree of branching is from 99.9 to 100%. See H. Frey et al., Acta Polym. 1997, 48, 30 for the definition of "degree of branching", the definition being:

$$DB = \frac{T+Z}{T+Z+L} \times 100\%,$$

(where T is the average number of terminal monomer units, Z is the average number of branched monomer units, and L is the average number of linear monomer units in the macromolecules of the respective substances).

Component B1) preferably has a number-average molar mass $M_n$ of from 100 to 15 000 g/mol, preferably from 200 to 12 000 g/mol, and in particular from 500 to 10 000 g/mol (GPC, PMMA standard).

The glass transition temperature Tg is in particular from −80 to +140° C., preferably from −60 to 120° C. (according to DSC, DIN 53765).

In particular, the viscosity (mPas) at 23° C. (to DIN 53019) is from 50 to 200 000, in particular from 100 to 150 000, and very particularly preferably from 200 to 100 000.

Component B1) is preferably obtainable via a process which comprises at least the following steps:
a) reaction of at least one organic carbonate (A) of the general formula $RO[(CO)]_nOR$ with at least one aliphatic, aliphatic/aromatic or aromatic alcohol (B) which has at least 3 OH groups, with elimination of alcohols ROH to give one or more condensates (K), where each R, independently of the others, is a straight-chain or branched aliphatic, aromatic/aliphatic or aromatic hydrocarbon radical having from 1 to 20 carbon atoms, and where the radicals R may also have bonding to one another to form a ring, and n is a whole number from 1 to 5, or
ab) reaction of phosgene, diphosgene, or triphosgene with abovementioned alcohol (B), with elimination of hydrogen chloride,
and
b) intermolecular reaction of the condensates (K) to give a highly functional, highly branched, or highly functional, hyperbranched polycarbonate,
where the quantitative proportion of the OH groups to the carbonates in the reaction mixture is selected in such a way that the condensates (K) comprise on average either one carbonate group and more than one OH group or one OH group and more than one carbonate group.

Phosgene, diphosgene, or triphosgene may be used as starting material, but preference is given to organic carbonates.

Each of the radicals R of the organic carbonates (A) used as starting material and having the general formula $RO(CO)_nOR$ is, independently of the others, a straight-chain or branched aliphatic, aromatic/aliphatic or aromatic hydrocarbon radical having from 1 to 20 carbon atoms. The two radicals R may also have bonding to one another to form a ring. The radical is preferably an aliphatic hydrocarbon radical, and particularly preferably a straight-chain or branched alkyl radical having from 1 to 5 carbon atoms, or a substituted or unsubstituted phenyl radical.

In particular, use is made of simple carbonates of the formula $RO(CO)_nOR$; n is preferably from 1 to 3, in particular 1.

By way of example, dialkyl or diaryl carbonates may be prepared from the reaction of aliphatic, araliphatic, or aromatic alcohols, preferably monoalcohols, with phosgene. They may also be prepared by way of oxidative carbonylation of the alcohols or phenols by means of CO in the presence of noble metals, oxygen, or $NO_x$. In relation to preparation methods for diaryl or dialkyl carbonates, see also "Ullmann's Encyclopedia of Industrial Chemistry", 6th edition, 2000 Electronic Release, Verlag Wiley-VCH.

Examples of suitable carbonates comprise aliphatic, aromatic/aliphatic or aromatic carbonates, such as ethylene carbonate, propylene 1,2- or 1,3-carbonate, diphenyl carbonate, ditolyl carbonate, dixylyl carbonate, dinaphthyl carbonate, ethyl phenyl carbonate, dibenzyl carbonate, dimethyl carbonate, diethyl carbonate, dipropyl carbonate, dibutyl carbonate, diisobutyl carbonate, dipentyl carbonate, dihexyl carbonate, dicyclohexyl carbonate, diheptyl carbonate, dioctyl carbonate, didecyl carbonate, or didodecyl carbonate.

Examples of carbonates where n is greater than 1 comprise dialkyl dicarbonates, such as di(tert-butyl) dicarbonate, or dialkyl tricarbonates, such as di(tert-butyl) tricarbonate.

It is preferable to use aliphatic carbonates, in particular those in which the radicals comprise from 1 to 5 carbon atoms, e.g. dimethyl carbonate, diethyl carbonate, dipropyl carbonate, dibutyl carbonate, or diisobutyl carbonate.

The organic carbonates are reacted with at least one aliphatic alcohol (B) which has at least 3 OH groups, or with mixtures of two or more different alcohols.

Examples of compounds having at least three OH groups comprise glycerol, trimethylolmethane, trimethylolethane, trimethylolpropane, 1,2,4-butanetriol, tris(hydroxymethyl) amine, tris(hydroxyethyl)amine, tris(hydroxypropyl)amine, pentaerythritol, diglycerol, triglycerol, polyglycerols, bis(trimethylolpropane), tris(hydroxymethyl) isocyanurate, tris (hydroxyethyl) isocyanurate, phloroglucinol, trihydroxytoluene, trihydroxydimethylbenzene, phloroglucides, hexahydroxybenzene, 1,3,5-benzenetrimethanol, 1,1,1-tris (4'-hydroxyphenyl)methane, 1,1,1-tris(4'-hydroxyphenyl) ethane, bis(trimethylolpropane), or sugars, e.g. glucose, trihydric or higher polyhydric polyetherols based on trihydric or higher polyhydric alcohols and ethylene oxide, propylene oxide, or butylene oxide, or polyesterols. Particular preference is given here to glycerol, trimethylolethane, trimethylolpropane, 1,2,4-butanetriol, pentaerythritol, and also their polyetherols based on ethylene oxide or propylene oxide.

These polyhydric alcohols may also be used in a mixture with dihydric alcohols (B'), with the proviso that the average total OH functionality of all of the alcohols used is greater than 2. Examples of suitable compounds having two OH groups comprise ethylene glycol, diethylene glycol, triethylene glycol, 1,2- and 1,3-propanediol, dipropylene glycol, tripropylene glycol, neopentyl glycol, 1,2-, 1,3-, and 1,4-butanediol, 1,2-, 1,3-, and 1,5-pentanediol, hexanediol, cyclopentanediol, cyclohexanediol, cyclohexanedimethanol, bis(4-hydroxycyclohexyl)methane, bis(4-hydroxycyclohexyl)-ethane, 2,2-bis(4-hydroxycyclohexyl)propane, 1,1'-bis(4-hydroxyphenyl)-3,3,5-tri-methylcyclohexane, resorcinol, hydroquinone, 4,4'-dihydroxyphenyl, bis(4-bis (hydroxy-phenyl) sulfide, bis(4-hydroxyphenyl) sulfone, bis (hydroxymethyl)benzene, bis-(hydroxymethyl)toluene, bis (p-hydroxyphenyl)methane, bis(p-hydroxyphenyl)ethane, 2,2-bis(p-hydroxyphenyl)propane, 1,1-bis(p-hydroxyphenyl)cyclohexane, dihydroxy-benzophenone, dihydric polyether polyols based on ethylene oxide, propylene oxide, butylene oxide, or mixtures of these, polytetrahydrofuran, polycaprolactone, or polyesterols based on diols and dicarboxylic acids.

The diols serve for fine adjustment of the properties of the polycarbonate. If use is made of dihydric alcohols, the ratio of dihydric alcohols (B') to the at least trihydric alcohols (B) is set by the person skilled in the art and depends on the desired properties of the polycarbonate. The amount of the alcohol(s) (B') is generally from 0 to 50 mol %, based on the total amount of all of the alcohols (B) and (B') taken together. The amount is preferably from 0 to 45 mol %, particularly preferably from 0 to 35 mol %, and very particularly preferably from 0 to 30 mol %.

The reaction of phosgene, diphosgene, or triphosgene with the alcohol or alcohol mixture generally takes place with elimination of hydrogen chloride, and the reaction of the carbonates with the alcohol or alcohol mixture to give the inventive highly functional highly branched polycarbonate takes place with elimination of the monofunctional alcohol or phenol from the carbonate molecule.

The highly functional highly branched polycarbonates formed by the inventive process have termination by hydroxy groups and/or by carbonate groups after the reaction, i.e. with no further modification. They have good solubility in various solvents, e.g. in water, alcohols, such as methanol, ethanol, butanol, alcohol/water mixtures, acetone, 2-butanone, ethyl acetate, butyl acetate, methoxypropyl acetate, methoxyethyl acetate, tetrahydrofuran, dimethylformamide, dimethylacetamide, N-methylpyrrolidone, ethylene carbonate, or propylene carbonate.

For the purposes of this invention, a highly functional polycarbonate is a product which, besides the carbonate groups which form the polymer skeleton, further has at least three, preferably at least six, more preferably at least ten, terminal or pendant functional groups. The functional groups are carbonate groups and/or OH groups. There is in principle no upper restriction on the number of the terminal or pendant functional groups, but products having a very high number of functional groups can have undesired properties, such as high viscosity or poor solubility. The highly functional polycarbonates of the present invention mostly have not more than 500 terminal or pendant functional groups, preferably not more than 100 terminal or pendant functional groups.

When preparing the highly functional polycarbonates B1), it is necessary to adjust the ratio of the compounds comprising OH groups to phosgene or carbonate in such a way that the simplest resultant condensate (hereinafter termed condensate (K)) comprises on average either one carbonate group or carbamoyl group and more than one OH group or one OH group and more than one carbonate group or carbamoyl group. The simplest structure of the condensate (K) composed of a carbonate (A) and a di- or polyalcohol (B) here results in the arrangement $XY_n$ or $Y_nX$, where X is a carbonate group, Y is a hydroxy group, and n is generally a number from 1 to 6, preferably from 1 to 4, particularly preferably from 1 to 3. The reactive group which is the single resultant group here is generally termed "focal group" below.

By way of example, if during the preparation of the simplest condensate (K) from a carbonate and a dihydric alcohol the reaction ratio is 1:1, the average result is a molecule of XY type, illustrated by the general formula 1.

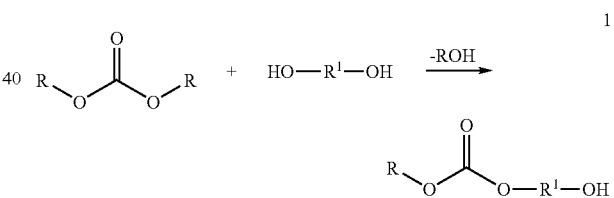

During the preparation of the condensate (K) from a carbonate and a trihydric alcohol with a reaction ratio of 1:1, the average result is a molecule of $XY_2$ type, illustrated by the general formula 2. A carbonate group is focal group here.

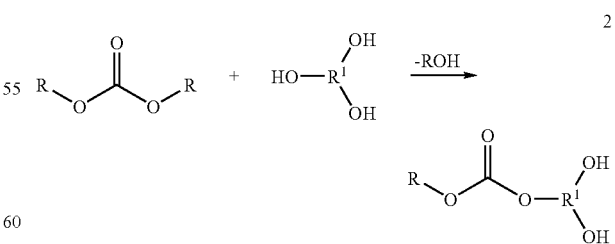

During the preparation of the condensate (K) from a carbonate and a tetrahydric alcohol, likewise with the reaction ratio 1:1, the average result is a molecule of $XY_3$ type, illustrated by the general formula 3. A carbonate group is focal group here.

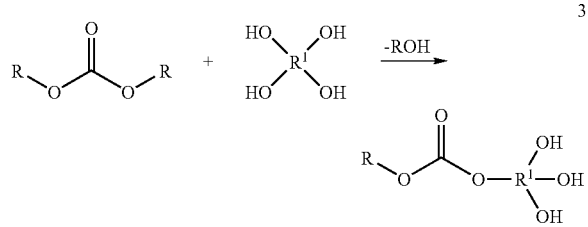

R in the formulae 1-3 has the definition given at the outset, and $R^1$ is an aliphatic or aromatic radical.

The condensate (K) may, by way of example, also be prepared from a carbonate and a trihydric alcohol, as illustrated by the general formula 4, the molar reaction ratio being 2:1. Here, the average result is a molecule of $X_2Y$ type, an OH group being focal group here. In formula 4, R and $R^1$ are as defined in formulae 1-3.

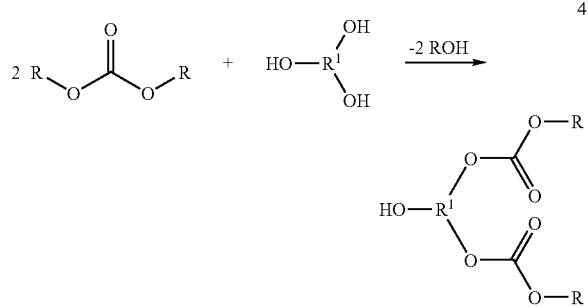

If difunctional compounds, e.g. a dicarbonate or a diol, are also added to the components, this extends the chains, as illustrated by way of example in the general formula 5. The average result is again a molecule of $XY_2$ type, a carbonate group being focal group.

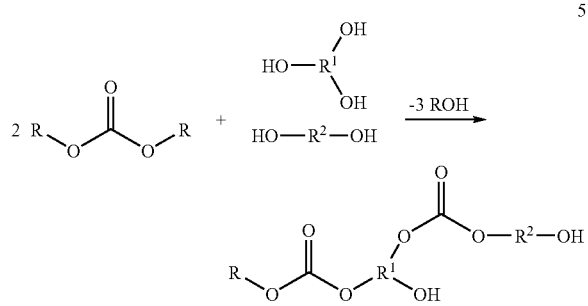

In formula 5, $R^2$ is an organic, preferably aliphatic radical, and R and $R^1$ are as defined above.

It is also possible to use two or more condensates (K) for the synthesis. Here, firstly two or more alcohols or two or more carbonates may be used. Furthermore, mixtures of various condensates of different structure can be obtained via the selection of the ratio of the alcohols used and of the carbonates or the phosgenes. This may be illustrated taking the example of the reaction of a carbonate with a trihydric alcohol. If the starting products are reacted in a ratio of 1:1, as shown in (II), the result is an $XY_2$ molecule. If the starting products are reacted in a ratio of 2:1, as shown in (IV), the result is an $X_2Y$ molecule. If the ratio is from 1:1 to 2:1, the result is a mixture of $XY_2$ and $X_2Y$ molecules.

According to the invention, the simple condensates (K) described by way of example in the formulae 1-5 preferentially react intermolecularly to form highly functional polycondensates, hereinafter termed polycondensates (P). The reaction to give the condensate (K) and to give the polycondensate (P) usually takes place at a temperature of from 0 to 250° C., preferably from 60 to 160° C., in bulk or in solution. Use may generally be made here of any of the solvents which are inert with respect to the respective starting materials. Preference is given to use of organic solvents, e.g. decane, dodecane, benzene, toluene, chlorobenzene, xylene, dimethylformamide, dimethylacetamide, or solvent naphtha.

In one preferred embodiment, the condensation reaction is carried out in bulk. To accelerate the reaction, the phenol or the monohydric alcohol ROH liberated during the reaction can be removed by distillation from the reaction equilibrium if appropriate at reduced pressure.

If removal by distillation is intended, it is generally advisable to use those carbonates which liberate alcohols ROH with a boiling point below 140° C. during the reaction.

Catalysts or catalyst mixtures may also be added to accelerate the reaction. Suitable catalysts are compounds which catalyze esterification or transesterification reactions, e.g. alkali metal hydroxides, alkali metal carbonates, alkali metal hydrogencarbonates, preferably of sodium, of potassium, or of cesium, tertiary amines, guanidines, ammonium compounds, phosphonium compounds, organoaluminum, organotin, organozinc, organotitanium, organozirconium, or organobismuth compounds, or else what are known as double metal cyanide (DMC) catalysts, e.g. as described in DE 10138216 or DE 10147712.

It is preferable to use potassium hydroxide, potassium carbonate, potassium hydrogencarbonate, diazabicyclooctane (DABCO), diazabicyclononene (DBN), diazabicycloundecene (DBU), imidazoles, such as imidazole, 1-methylimidazole, or 1,2-dimethylimidazole, titanium tetrabutoxide, titanium tetraisopropoxide, dibutyltin oxide, dibutyltin dilaurate, stannous dioctoate, zirconium acetylacetonate, or mixtures thereof.

The amount of catalyst generally added is from 50 to 10 000 ppm by weight, preferably from 100 to 5000 ppm by weight, based on the amount of the alcohol mixture or alcohol used.

It is also possible to control the intermolecular polycondensation reaction via addition of the suitable catalyst or else via selection of a suitable temperature. The average molecular weight of the polymer (P) may moreover be adjusted by way of the composition of the starting components and by way of the residence time.

The condensates (K) and the polycondensates (P) prepared at an elevated temperature are usually stable at room temperature for a relatively long period.

The nature of the condensates (K) permits polycondensates (P) with different structures to result from the condensation reaction, these having branching but no crosslinking. Furthermore, in the ideal case, the polycondensates (P) have either one carbonate group as focal group and more than two OH groups or else one OH group as focal group and more than two carbonate groups. The number of the reactive groups here is the result of the nature of the condensates (K) used and the degree of polycondensation.

By way of example, a condensate (K) according to the general formula 2 can react via triple intermolecular condensation to give two different polycondensates (P), represented in the general formulae 6 and 7.

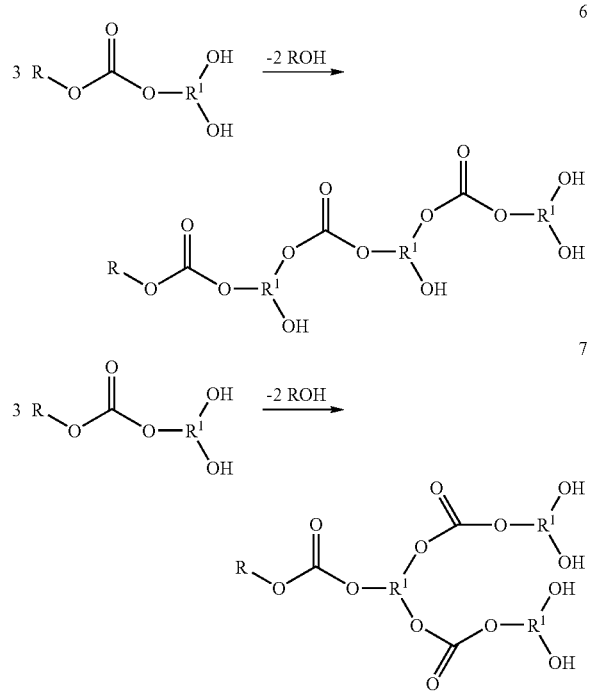

In formula 6 and 7, R and $R^1$ are as defined above.

There are various ways of terminating the intermolecular polycondensation reaction. By way of example, the temperature may be lowered to a range where the reaction stops and the product (K) or the polycondensate (P) is storage-stable.

It is also possible to deactivate the catalyst, for example in the case of basic catalysts via addition of Lewis acids or proton acids.

In another embodiment, as soon as the intermolecular reaction of the condensate (K) has produced a polycondensate (P) with the desired degree of polycondensation, a product having groups reactive toward the focal group of (P) may be added to the product (P) to terminate the reaction. In the case of a carbonate group as focal group, by way of example, a mono-, di-, or polyamine may be added. In the case of a hydroxy group as focal group, by way of example, a mono-, di-, or polyisocyanate, or a compound comprising epoxy groups, or an acid derivative which reacts with OH groups, can be added to the product (P).

The inventive highly functional polycarbonates are mostly prepared in the pressure range from 0.1 mbar to 20 bar, preferably at from 1 mbar to 5 bar, in reactors or reactor cascades which are operated batchwise, semicontinuously, or continuously.

The inventive products can be further processed without further purification after their preparation by virtue of the abovementioned adjustment of the reaction conditions and, if appropriate, by virtue of the selection of the suitable solvent.

In another preferred embodiment, the product is stripped, i.e. freed from low-molecular-weight, volatile compounds. For this, once the desired degree of conversion has been reached the catalyst may optionally be deactivated and the low-molecular-weight volatile constituents, e.g. monoalcohols, phenols, carbonates, hydrogen chloride, or volatile oligomeric or cyclic compounds, can be removed by distillation, if appropriate with introduction of a gas, preferably nitrogen, carbon dioxide, or air, if appropriate at reduced pressure.

In another preferred embodiment, the inventive polycarbonates may comprise other functional groups besides the functional groups present at this stage by virtue of the reaction. The functionalization may take place during the process to increase molecular weight, or else subsequently, i.e. after completion of the actual polycondensation.

If, prior to or during the process to increase molecular weight, components are added which have other functional groups or functional elements besides hydroxy or carbonate groups, the result is a polycarbonate polymer with randomly distributed functionalities other than the carbonate or hydroxy groups.

Effects of this type can, by way of example, be achieved via addition, during the polycondensation, of compounds which bear other functional groups or functional elements, such as mercapto groups, primary, secondary or tertiary amino groups, ether groups, derivatives of carboxylic acids, derivatives of sulfonic acids, derivatives of phosphonic acids, silane groups, siloxane groups, aryl radicals, or long-chain alkyl radicals, besides hydroxy groups, carbonate groups or carbamoyl groups. Examples of compounds which may be used for modification by means of carbamate groups are ethanolamine, propanolamine, isopropanolamine, 2-(butylamino) ethanol, 2-(cyclohexyl-amino)ethanol, 2-amino-1-butanol, 2-(2'-aminoethoxy)ethanol or higher alkoxylation products of ammonia, 4-hydroxypiperidine, 1-hydroxyethylpiperazine, diethanolamine, dipropanolamine, diisopropanolamine, tris(hydroxymethyl)aminomethane, tris(hydroxy-ethyl)aminomethane, ethylenediamine, propylenediamine, hexamethylenediamine or isophoronediamine.

An example of a compound which can be used for modification with mercapto groups is mercaptoethanol. By way of example, tertiary amino groups can be produced via incorporation of N-methyldiethanolamine, N-methyldipropanolamine or N,N-dimethyl-ethanolamine. By way of example, ether groups may be generated via co-condensation of dihydric or higher polyhydric polyetherols. Long-chain alkyl radicals can be introduced via reaction with long-chain alkanediols, and reaction with alkyl or aryl diisocyanates generates polycarbonates having alkyl, aryl, and urethane groups, or urea groups.

Ester groups can be produced via addition of dicarboxylic acids, tricarboxylic acids, for example dimethyl terephalate, or tricarboxylic esters.

Subsequent functionalization can be achieved by using an additional step of the process (step c)) to react the resultant highly functional highly branched, or highly functional hyperbranched polycarbonate with a suitable functionalizing reagent which can react with the OH and/or carbonate groups or carbamoyl groups of the polycarbonate.

By way of example, highly functional highly branched, or highly functional hyperbranched polycarbonates comprising hydroxy groups can be modified via addition of molecules comprising acid groups or isocyanate groups. By way of example, polycarbonates comprising acid groups can be obtained via reaction with compounds comprising anhydride groups.

Highly functional polycarbonates comprising hydroxy groups may moreover also be converted into highly functional polycarbonate polyether polyols via reaction with alkylene oxides, e.g. ethylene oxide, propylene oxide, or butylene oxide.

A great advantage of the process is its cost-effectiveness. Both the reaction to give a condensate (K) or polycondensate (P) and also the reaction of (K) or (P) to give polycarbonates with other functional groups or elements can take place in one reactor, this being advantageous technically and in terms of cost-effectiveness.

The inventive molding compositions may comprise, as component B2), at least one hyperbranched polyester of $A_xB_y$ type, where
x is at least 1.1, preferably at least 1.3, in particular at least 2
y is at least 2.1, preferably at least 2.5, in particular at least 3.

Use may also be made of mixtures as units A and/or B, of course.

An $A_xB_y$-type polyester is a condensate composed of an x-functional molecule A and a y-functional molecule B. By way of example, mention may be made of a polyester composed of adipic acid as molecule A (x=2) and glycerol as molecule B (y=3).

For the purposes of this invention, hyperbranched polyesters B2) are non-crosslinked macromolecules having hydroxy groups and carbonate groups, these having both structural and molecular non-uniformity. Their structure may firstly be based on a central molecule in the same way as dendrimers, but with non-uniform chain length of the branches. Secondly, they may also have a linear structure with functional pendant groups, or else they may combine the two extremes, having linear and branched molecular portions. See also P. J. Flory, J. Am. Chem. Soc. 1952, 74, 2718, and H. Frey et al., Chem. Eur. J. 2000, 6, no. 14, 2499 for the definition of dendrimeric and hyperbranched polymers.

"Hyperbranched" in the context of the present invention means that the degree of branching (DB), i.e. the average number of dendritic linkages plus the average number of end groups per molecule, is from 10 to 99.9%, preferably from 20 to 99%, particularly preferably from 20 to 95%.

"Dendrimer" in the context of the present invention means that the degree of branching is from 99.9 to 100%. See H. Frey et al., Acta Polym. 1997, 48, 30 for the definition of "degree of branching".

Component B2) preferably has an $M_n$ of from 300 to 30 000 g/mol, in particular from 400 to 25 000 g/mol, and very particularly from 500 to 20 000 g/mol, determined by means of GPC, PMMA standard, dimethylacetamide eluent.

B2) preferably has an OH number of from 0 to 600 mg KOH/g of polyester, preferably of from 1 to 500 mg KOH/g of polyester, in particular from 20 to 500 mg KOH/g of polyester to DIN 53240, and preferably a COOH number of from 0 to 600 mg KOH/g of polyester, preferably from 1 to 500 mg KOH/g of polyester, and in particular from 2 to 500 mg KOH/g of polyester.

The $T_g$ is preferably from −50° C. to 140° C., and in particular from −50 to 100° C. (by means of DSC, to DIN 53765).

Preference is particularly given to those components B2) in which at least one OH or COOH number is greater than 0, preferably greater than 0.1, and in particular greater than 0.5.

The inventive component B2) is in particular obtainable via the processes described below, specifically by reacting
(a) one or more dicarboxylic acids or one or more derivatives of the same with one or more at least trihydric alcohols
or
(b) one or more tricarboxylic acids or higher polycarboxylic acids or one or more derivatives of the same with one or more diols
in the presence of a solvent and optionally in the presence of an inorganic, organometallic, or low-molecular-weight organic catalyst, or of an enzyme. The reaction in solvent is the preferred preparation method.

For the purposes of the present invention, highly functional hyperbranched polyesters B2) have molecular and structural non-uniformity. Their molecular non-uniformity distinguishes them from dendrimers, and they can therefore be prepared at considerably lower cost.

Among the dicarboxylic acids which can be reacted according to variant (a) are, by way of example, oxalic acid, malonic acid, succinic acid, glutaric acid, adipic acid, pimelic acid, suberic acid, azelaic acid, sebacic acid, undecane-α,ω-dicarboxylic acid, dodecane-α,ω-dicarboxylic acid, cis- and trans-cyclohexane-1,2-dicarboxylic acid, cis- and trans-cyclohexane-1,3-dicarboxylic acid, cis- and trans-cyclohexane-1,4-di-carboxylic acid, cis- and trans-cyclopentane-1,2-dicarboxylic acid, and cis- and trans-cyclopentane-1,3-dicarboxylic acid,
and the abovementioned dicarboxylic acids may have substitution by one or more radicals selected from
$C_1$-$C_{10}$-alkyl groups, such as methyl, ethyl, n-propyl, isopropyl, n-butyl, isobutyl, sec-butyl, tert-butyl, n-pentyl, isopentyl, sec-pentyl, neopentyl, 1,2-dimethylpropyl, isoamyl, n-hexyl, isohexyl, sec-hexyl, n-heptyl, isoheptyl, n-octyl, 2-ethylhexyl, n-nonyl, and n-decyl,
$C_3$-$C_{12}$-cycloalkyl groups, such as cyclopropyl, cyclobutyl, cyclopentyl, cyclohexyl, cycloheptyl, cyclooctyl, cyclononyl, cyclodecyl, cycloundecyl, and cyclododecyl; preference is given to cyclopentyl, cyclohexyl, and cycloheptyl;
alkylene groups, such as methylene or ethylidene, or
$C_6$-$C_{14}$-aryl groups, such as phenyl, 1-naphthyl, 2-naphthyl, 1-anthryl, 2-anthryl, 9-anthryl, 1-phenanthryl, 2-phenanthryl, 3-phenanthryl, 4-phenanthryl, and 9-phenanthryl, preferably phenyl, 1-naphthyl, and 2-naphthyl, particularly preferably phenyl.

Examples which may be mentioned as representatives of substituted dicarboxylic acids are: 2-methylmalonic acid, 2-ethylmalonic acid, 2-phenylmalonic acid, 2-methylsuccinic acid, 2-ethylsuccinic acid, 2-phenylsuccinic acid, itaconic acid, 3,3-dimethylglutaric acid.

Among the dicarboxylic acids which can be reacted according to variant (a) are also ethylenically unsaturated acids, such as maleic acid and fumaric acid, and aromatic dicarboxylic acids, such as phthalic acid, isophthalic acid or terephthalic acid.

It is also possible to use mixtures of two or more of the abovementioned representative compounds.

The dicarboxylic acids may either be used as they stand or be used in the form of derivatives.

Derivatives are preferably
the relevant anhydrides in monomeric or else polymeric form,
mono- or dialkyl esters, preferably mono- or dimethyl esters, or the corresponding mono- or diethyl esters, or else the mono- and dialkyl esters derived from higher alcohols, such as n-propanol, isopropanol, n-butanol, isobutanol, tert-butanol, n-pentanol, n-hexanol,
and also mono- and divinyl esters, and
mixed esters, preferably methyl ethyl esters.

In the preferred preparation process it is also possible to use a mixture composed of a dicarboxylic acid and one or more of its derivatives. Equally, it is possible to use a mixture of two or more different derivatives of one or more dicarboxylic acids.

It is particularly preferable to use succinic acid, glutaric acid, adipic acid, phthalic acid, isophthalic acid, terephthalic acid, or the mono- or dimethyl esters thereof. It is very particularly preferable to use adipic acid.

Examples of at least trihydric alcohols which may be reacted are: glycerol, butane-1,2,4-triol, n-pentane-1,2,5-triol, n-pentane-1,3,5-triol, n-hexane-1,2,6-triol, n-hexane-1, 2,5-triol, n-hexane-1,3,6-triol, trimethylolbutane, trimethylolpropane or ditrimethylol-propane, trimethylolethane, pentaerythritol or dipentaerythritol; sugar alcohols, such as mesoerythritol, threitol, sorbitol, mannitol, or mixtures of the above at least trihydric alcohols. It is preferable to use glycerol, trimethylolpropane, trimethylolethane, and pentaerythritol.

Examples of tricarboxylic acids or polycarboxylic acids which can be reacted according to variant (b) are benzene-1,2,4-tricarboxylic acid, benzene-1,3,5-tricarboxylic acid, benzene-1,2,4,5-tetracarboxylic acid, and mellitic acid.

Tricarboxylic acids or polycarboxylic acids may be used in the inventive reaction either as they stand or else in the form of derivatives.

Derivatives are preferably
the relevant anhydrides in monomeric or else polymeric form,
mono-, di-, or trialkyl esters, preferably mono-, di-, or trimethyl esters, or the corresponding mono-, di-, or triethyl esters, or else the mono-, di-, and triesters derived from higher alcohols, such as n-propanol, isopropanol, n-butanol, isobutanol, tert-butanol, n-pentanol, n-hexanol, or else mono-, di-, or trivinyl esters and mixed methyl ethyl esters.

For the purposes of the present invention, it is also possible to use a mixture composed of a tri- or polycarboxylic acid and one or more of its derivatives. For the purposes of the present invention it is likewise possible to use a mixture of two or more different derivatives of one or more tri- or polycarboxylic acids, in order to obtain component B2).

Examples of diols used for variant (b) of the present invention are ethylene glycol, propane-1,2-diol, propane-1,3-diol, butane-1,2-diol, butane-1,3-diol, butane-1,4-diol, butane-2,3-diol, pentane-1,2-diol, pentane-1,3-diol, pentane-1,4-diol, pentane-1,5-diol, pentane-2,3-diol, pentane-2,4-diol, hexane-1,2-diol, hexane-1,3-diol, hexane-1,4-diol, hexane-1,5-diol, hexane-1,6-diol, hexane-2,5-diol, heptane-1,2-diol, 1,7-heptanediol, 1,8-octanediol, 1,2-octanediol, 1,9-nonanediol, 1,10-decanediol, 1,2-decanediol, 1,12-dodecanediol, 1,2-dodecanediol, 1,5-hexadiene-3,4-diol, cyclopentanediols, cyclohexanediols, inositol and derivatives, (2)-methylpentane-2,4-diol, 2,4-dimethyl-pentane-2,4-diol, 2-ethylhexane-1,3-diol, 2,5-dimethylhexane-2,5-diol, 2,2,4-trimethyl-pentane-1,3-diol, pinacol, diethylene glycol, triethylene glycol, dipropylene glycol, tripropylene glycol, polyethylene glycols $HO(CH_2CH_2O)_n$—H or polypropylene glycols $HO(CH[CH_3]CH_2O)_n$—H or mixtures of two or more representative compounds of the above compounds, where n is a whole number and n=4 to 25. One, or else both, hydroxy groups here in the abovementioned diols may also be replaced by SH groups. Preference is given to ethylene glycol, propane-1,2-diol, and diethylene glycol, triethylene glycol, dipropylene glycol, and tripropylene glycol.

The molar ratio of the molecules A to molecules B in the $A_xB_y$ polyester in the variants (a) and (b) is from 4:1 to 1:4, in particular from 2:1 to 1:2.

The at least trihydric alcohols reacted according to variant (a) of the process may have hydroxy groups of which all have identical reactivity. Preference is also given here to at least trihydric alcohols whose OH groups initially have identical reactivity, but where reaction with at least one acid group can induce a fall-off in reactivity of the remaining OH groups as a result of steric or electronic effects. By way of example, this applies when trimethylolpropane or pentaerythritol is used.

However, the at least trihydric alcohols reacted according to variant (a) may also have hydroxy groups having at least two different chemical reactivities.

The different reactivity of the functional groups here may derive either from chemical causes (e.g. primary/secondary/tertiary OH group) or from steric causes.

By way of example, the triol may comprise a triol which has primary and secondary hydroxy groups, a preferred example being glycerol.

When the inventive reaction is carried out according to variant (a), it is preferable to operate in the absence of diols and of monohydric alcohols.

When the inventive reaction is carried out according to variant (b), it is preferable to operate in the absence of mono- or dicarboxylic acids.

The inventive process is carried out in the presence of a solvent. By way of example, hydrocarbons are suitable, such as paraffins or aromatics. Particularly suitable paraffins are n-heptane and cyclohexane. Particularly suitable aromatics are toluene, ortho-xylene, meta-xylene, para-xylene, xylene in the form of an isomer mixture, ethylbenzene, chlorobenzene, and ortho- and meta-dichlorobenzene. Other solvents very particularly suitable in the absence of acidic catalysts are: ethers, such as dioxane or tetrahydrofuran, and ketones, such as methyl ethyl ketone and methyl isobutyl ketone.

According to the invention, the amount of solvent added is at least 0.1% by weight, based on the weight of the starting materials used and to be reacted, preferably at least 1% by weight, and particularly preferably at least 10% by weight. It is also possible to use excesses of solvent, based on the weight of starting materials used and to be reacted, e.g. from 1.01 to 10 times the amount. Solvent amounts of more than 100 times the weight of the starting materials used and to be reacted are not advantageous, because the reaction rate decreases markedly at markedly lower concentrations of the reactants, giving uneconomically long reaction times.

To carry out the process preferred according to the invention, operations may be carried out in the presence of a dehydrating agent as additive, added at the start of the reaction. Suitable examples are molecular sieves, in particular 4 Å molecular sieve, $MgSO_4$, and $Na_2SO_4$. During the reaction it is also possible to add further dehydrating agent or to replace dehydrating agent by fresh dehydrating agent. During the reaction it is also possible to remove the water or alcohol formed by distillation and, for example, to use a water trap.

The reaction may be carried out in the absence of acidic catalysts. It is preferable to operate in the presence of an acidic inorganic, organometallic, or organic catalyst, or a mixture composed of two or more acidic inorganic, organometallic, or organic catalysts.

For the purposes of the present invention, examples of acidic inorganic catalysts are sulfuric acid, phosphoric acid, phosphonic acid, hypophosphorous acid, aluminum sulfate hydrate, alum, acidic silica gel (pH=6, in particular =5), and acidic aluminum oxide. Examples of other compounds which can be used as acidic inorganic catalysts are aluminum compounds of the general formula $Al(OR)_3$ and titanates of the general formula $Ti(OR)_4$, where each of the radicals R may be identical or different and is selected independently of the others from $C_1$-$C_{10}$-alkyl radicals, such as methyl, ethyl, n-propyl, isopropyl, n-butyl, isobutyl, sec-butyl, tert-butyl, n-pentyl, isopentyl, sec-pentyl, neopentyl, 1,2-dimethylpropyl, isoamyl, n-hexyl, isohexyl, sec-hexyl, n-heptyl, isoheptyl, n-octyl, 2-ethylhexyl, n-nonyl, and n-decyl, $C_3$-$C_{12}$-cycloalkyl radicals, such as cyclopropyl, cyclobutyl, cyclopentyl, cyclohexyl, cycloheptyl, cyclooctyl, cyclononyl, cyclodecyl, cycloundecyl, and cyclododecyl; preference is given to cyclopentyl, cyclohexyl, and cycloheptyl.

Each of the radicals R in Al(OR)$_3$ or Ti(OR)$_4$ is preferably identical and selected from isopropyl or 2-ethylhexyl.

Examples of preferred acidic organometallic catalysts are selected from dialkyltin oxides R$_2$SnO, where R is defined as above. A particularly preferred representative compound for acidic organometallic catalysts is di-n-butyltin oxide, which is commercially available as "oxo-tin", or di-n-butyltin dilaurate.

Preferred acidic organic catalysts are acidic organic compounds having, by way of example, phosphate groups, sulfonic acid groups, sulfate groups, or phosphonic acid groups. Particular preference is given to sulfonic acids, such as para-toluenesulfonic acid. Acidic ion exchangers may also be used as acidic organic catalysts, e.g. polystyrene resins comprising sulfonic acid groups and crosslinked with about 2 mol % of divinylbenzene.

It is also possible to use combinations of two or more of the abovementioned catalysts. It is also possible to use an immobilized form of those organic or organometallic, or else inorganic catalysts which take the form of discrete molecules.

If the intention is to use acidic inorganic, organometallic, or organic catalysts, according to the invention the amount used is from 0.1 to 10% by weight, preferably from 0.2 to 2% by weight, of catalyst.

The inventive process is carried out under inert gas, e.g. under carbon dioxide, nitrogen, or a noble gas, among which mention may particularly be made of argon.

The inventive process is carried out at temperatures of from 60 to 200° C. It is preferable to operate at temperatures of from 130 to 180° C., in particular up to 150° C., or below that temperature. Maximum temperatures up to 145° C. are particularly preferred, and temperatures up to 135° C. are very particularly preferred.

The pressure conditions for the inventive process are not critical per se. It is possible to operate at markedly reduced pressure, e.g. at from 10 to 500 mbar. The inventive process may also be carried out at pressures above 500 mbar. A reaction at atmospheric pressure is preferred for reasons of simplicity; however, conduct at slightly increased pressure is also possible, e.g. up to 1200 mbar. It is also possible to operate at markedly increased pressure, e.g. at pressures up to 10 bar. Reaction at atmospheric pressure is preferred.

The reaction time for the inventive process is usually from 10 minutes to 25 hours, preferably from 30 minutes to 10 hours, and particularly preferably from one to 8 hours.

Once the reaction has ended, the highly functional hyperbranched polyesters can easily be isolated, e.g. by removing the catalyst by filtration and concentrating the mixture, the concentration process here usually being carried out at reduced pressure. Other work-up methods with good suitability are precipitation after addition of water, followed by washing and drying.

Component B2) can also be prepared in the presence of enzymes or decomposition products of enzymes (according to DE-A 101 63163). For the purposes of the present invention, the term acidic organic catalysts does not include the dicarboxylic acids reacted according to the invention.

It is preferable to use lipases or esterases. Lipases and esterases with good suitability are *Candida cylindracea, Candida lipolytica, Candida rugosa, Candida antarctica, Candida utilis, Chromobacterium viscosum, Geotrichum viscosum, Geotrichum candidum, Mucorjavanicus, Mucor mihei*, pig pancreas, *pseudomonas* spp., *pseudomonas fluorescens, Pseudomonas cepacia, Rhizopus arrhizus, Rhizopus delemar, Rhizopus niveus, Rhizopus oryzae, Aspergillus niger, Penicillium roquefortii, Penicillium camembertii*, or esterase from *Bacillus* spp. and *Bacillus thermoglucosidasius. Candida antarctica* lipase B is particularly preferred. The enzymes listed are commercially available, for example from Novozymes Biotech Inc., Denmark.

The enzyme is preferably used in immobilized form, for example on silica gel or Lewatit®. The processes for immobilizing enzymes are known per se, e.g. from Kurt Faber, "Biotransformations in organic chemistry", 3rd edition 1997, Springer Verlag, Chapter 3.2 "Immobilization" pp. 345-356. Immobilized enzymes are commercially available, for example from Novozymes Biotech Inc., Denmark.

The amount of immobilized enzyme used is from 0.1 to 20% by weight, in particular from 10 to 15% by weight, based on the total weight of the starting materials used and to be reacted.

The inventive process is carried out at temperatures above 60° C. It is preferable to operate at temperatures of 100° C. or below that temperature. Preference is given to temperatures up to 80° C., very particular preference is given to temperatures of from 62 to 75° C., and still more preference is given to temperatures of from 65 to 75° C.

The inventive process is carried out in the presence of a solvent. Examples of suitable compounds are hydrocarbons, such as paraffins or aromatics. Particularly suitable paraffins are n-heptane and cyclohexane. Particularly suitable aromatics are toluene, ortho-xylene, meta-xylene, para-xylene, xylene in the form of an isomer mixture, ethylbenzene, chlorobenzene and ortho- and meta-dichlorobenzene. Other very particularly suitable solvents are: ethers, such as dioxane or tetrahydrofuran, and ketones, such as methyl ethyl ketone and methyl isobutyl ketone.

The amount of solvent added is at least 5 parts by weight, based on the weight of the starting materials used and to be reacted, preferably at least 50 parts by weight, and particularly preferably at least 100 parts by weight. Amounts of more than 10 000 parts by weight of solvent are undesirable, because the reaction rate decreases markedly at markedly lower concentrations, giving uneconomically long reaction times.

The inventive process is carried out at pressures above 500 mbar. Preference is given to the reaction at atmospheric pressure or slightly increased pressure, for example at up to 1200 mbar. It is also possible to operate under markedly increased pressure, for example at pressures up to 10 bar. The reaction at atmospheric pressure is preferred.

The reaction time for the inventive process is usually from 4 hours to 6 days, preferably from 5 hours to 5 days, and particularly preferably from 8 hours to 4 days.

Once the reaction has ended, the highly functional hyperbranched polyesters can be isolated, e.g. by removing the enzyme by filtration and concentrating the mixture, this concentration process usually being carried out at reduced pressure. Other work-up methods with good suitability are precipitation after addition of water, followed by washing and drying.

The highly functional, hyperbranched polyesters obtainable by the inventive process feature particularly low contents of discolored and resinified material. For the definition of hyperbranched polymers, see also: P. J. Flory, J. Am. Chem. Soc. 1952, 74, 2718, and A. Sunder et al., Chem. Eur. J. 2000, 6, no. 1, 1-8. However, in the context of the present invention, "highly functional hyperbranched" means that the degree of branching, i.e. the average number of dendritic linkages plus the average number of end groups per molecule, is from 10 to 99.9%, preferably from 20 to 99%, particularly preferably from 30 to 90% (see in this connection H. Frey et al. Acta Polym. 1997, 48, 30).

The inventive polyesters have a molar mass $M_w$ of from 500 to 50 000 g/mol, preferably from 1000 to 20 000 g/mol, particularly preferably from 1000 to 19 000 g/mol. The polydispersity is from 1.2 to 50, preferably from 1.4 to 40, particularly preferably from 1.5 to 30, and very particularly preferably from 1.5 to 10. They are usually very soluble, i.e. clear solutions can be prepared using up to 50% by weight, in some cases even up to 80% by weight, of the inventive polyesters in tetrahydrofuran (THF), n-butyl acetate, ethanol, and numerous other solvents, with no gel particles detectable by the naked eye.

The inventive highly functional hyperbranched polyesters are carboxy-terminated, carboxy- and hydroxy-terminated, and preferably hydroxy-terminated.

The ratios of the components B1): 82) are preferably from 1:20 to 20:1, in particular from 1:15 to 15:1, and very particularly from 1:5 to 5:1.

The hyperbranched polycarbonates B1)/polyesters B2) used are in a fine state of subdivision in the polymer blend. The size of the particles in the compounded material is from 20 to 500 nm, preferably from 50 to 300 nm.

Compounded materials of this type are available commercially in the form of Ultradur® high speed.

The inventive molding compositions can comprise, as component C), from 0 to 60% by weight, in particular up to 50% by weight, of further additives and processing aids other than B).

The inventive molding compositions can comprise, as component C), from 0 to 5% by weight, preferably from 0.05 to 3% by weight, and in particular from 0.1 to 2% by weight, of at least one ester or amide of saturated or unsaturated aliphatic carboxylic acids having from 10 to 40, preferably from 16 to 22 carbon atoms, with saturated aliphatic alcohols or amines having from 2 to 40, preferably from 2 to 6, carbon atoms.

The carboxylic acids may be monobasic or dibasic. Examples which may be mentioned are pelargonic acid, palmitic acid, lauric acid, margaric acid, dodecanedioic acid, behenic acid, and particularly preferably stearic acid, capric acid, and also montanic acid (a mixture of fatty acids having from 30 to 40 carbon atoms).

The aliphatic alcohols may be mono- to tetrahydric. Examples of alcohols are n-butanol, n-octanol, stearyl alcohol, ethylene glycol, propylene glycol, neopentyl glycol, pentaerythritol, preference being given to glycerol and pentaerythritol.

The aliphatic amines may be mono-, di- or triamines. Examples of these are stearylamine, ethylenediamine, propylenediamine, hexamethylenediamine, di(6-aminohexyl) amine, particular preference being given to ethylenediamine and hexamethylenediamine. Correspondingly, preferred esters or amides are glyceryl distearate, glyceryl tristearate, ethylenediamine distearate, glyceryl monopalmitate, glyceryl trilaurate, glyceryl monobehenate, and pentaerythrityl tetrastearate.

It is also possible to use mixtures of various esters or amides, or esters with amides combined, the mixing ratio here being as desired.

Examples of amounts of usual additives C) are up to 40% by weight, preferably up to 30% by weight, of elastomeric polymers (also often termed impact modifiers, elastomers, or rubbers).

These are very generally copolymers which have preferably been built up from at least two of the following monomers: ethylene, propylene, butadiene, isobutene, isoprene, chloroprene, vinyl acetate, styrene, acrylonitrile and acrylates and/or methacrylates having from 1 to 18 carbon atoms in the alcohol component.

Polymers of this type are described, for example, in Houben-Weyl, Methoden der organischen Chemie, Vol. 14/1 (Georg-Thieme-Verlag, Stuttgart, Germany, 1961), pages 392-406, and in the monograph by C. B. Bucknall, "Toughened Plastics" (Applied Science Publishers, London, UK, 1977).

Some preferred types of such elastomers are described below.

Preferred types of such elastomers are those known as ethylene-propylene (EPM) and ethylene-propylene-diene (EPDM) rubbers.

EPM rubbers generally have practically no residual double bonds, whereas EPDM rubbers may have from 1 to 20 double bonds per 100 carbon atoms.

Examples which may be mentioned of diene monomers for EPDM rubbers are conjugated dienes, such as isoprene and butadiene, non-conjugated dienes having from 5 to 25 carbon atoms, such as 1,4-pentadiene, 1,4-hexadiene, 1,5-hexadiene, 2,5-dimethyl-1,5-hexadiene and 1,4-octadiene, cyclic dienes, such as cyclopentadiene, cyclohexadienes, cyclooctadienes and dicyclopentadiene, and also alkenylnorbornenes, such as 5-ethylidene-2-norbornene, 5-butylidene-2-norbornene, 2-methallyl-5-norbornene and 2-isopropenyl-5-norbornene, and tricyclodienes, such as 3-methyltricyclo[5.2.1.0$^{2,6}$]-3,8-decadiene, and mixtures of these. Preference is given to 1,5-hexadiene, 5-ethylidenenorbornene and dicyclopentadiene. The diene content of the EPDM rubbers is preferably from 0.5 to 50% by weight, in particular from 1 to 8% by weight, based on the total weight of the rubber.

EPM and EPDM rubbers may preferably also have been grafted with reactive carboxylic acids or with derivatives of these. Examples of these which may be mentioned are acrylic acid, methacrylic acid and derivatives thereof, e.g. glycidyl (meth)acrylate, and also maleic anhydride.

Copolymers of ethylene with acrylic acid and/or methacrylic acid and/or with the esters of these acids are another group of preferred rubbers. The rubbers may also comprise dicarboxylic acids, such as maleic acid and fumaric acid, or derivatives of these acids, e.g. esters and anhydrides, and/or monomers comprising epoxy groups. These monomers comprising dicarboxylic acid derivatives or comprising epoxy groups are preferably incorporated into the rubber by adding to the monomer mixture monomers comprising dicarboxylic acid groups and/or epoxy groups and having the general formula I, II, III or IV

R$^1$C(COOR$^2$)=C(COOR$^3$)R$^4$ (I)

(II)

CHR$^7$=CH—(CH$_2$)$_m$—O—(CHR$^6$)$_g$—CH–CHR$^5$ (III)

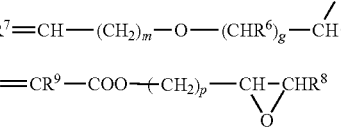

CH$_2$=CR$^9$—COO—(CH$_2$)$_p$—CH–CHR$^8$ (IV)

where $R^1$ to $R^9$ are hydrogen or alkyl having from 1 to 6 carbon atoms, and m is a whole number from 0 to 20, g is a whole number from 0 to 10 and p is a whole number from 0 to 5.

$R^1$ to $R^9$ are preferably hydrogen, where m is 0 or 1 and g is 1. The corresponding compounds are maleic acid, fumaric acid, maleic anhydride, allyl glycidyl ether and vinyl glycidyl ether.

Preferred compounds of the formulae I, II and IV are maleic acid, maleic anhydride and (meth)acrylates comprising epoxy groups, such as glycidyl acrylate and glycidyl methacrylate, and the esters with tertiary alcohols, such as tert-butyl acrylate. Although the latter have no free carboxy groups, their behavior approximates to that of the free acids and they are therefore termed monomers with latent carboxy groups.

The copolymers are advantageously composed of from 50 to 98% by weight of ethylene, from 0.1 to 20% by weight of monomers comprising epoxy groups and/or methacrylic acid and/or monomers comprising anhydride groups, the remaining amount being (meth)acrylates.

Particular preference is given to copolymers composed of from 50 to 98% by weight, in particular from 55 to 95% by weight, of ethylene,
from 0.1 to 40% by weight, in particular from 0.3 to 20% by weight, of glycidyl acrylate and/or glycidyl methacrylate, (meth)acrylic acid and/or maleic anhydride, and
from 1 to 45% by weight, in particular from 10 to 40% by weight, of n-butyl acrylate and/or 2-ethylhexyl acrylate.

Other preferred (meth)acrylates are the methyl, ethyl, propyl, isobutyl and tert-butyl esters.

Besides these, comonomers which may be used are vinyl esters and vinyl ethers.

The ethylene copolymers described above may be prepared by processes known per se, preferably by random copolymerization at high pressure and elevated temperature. Appropriate processes are well known.

Other preferred elastomers are emulsion polymers whose preparation is described, for example, by Blackley in the monograph "Emulsion polymerization". The emulsifiers and catalysts which can be used are known per se.

In principle it is possible to use homogeneously structured elastomers or else those with a shell structure. The shell-type structure is determined by the sequence of addition of the individual monomers; the morphology of the polymers is also affected by this sequence of addition.

Monomers which may be mentioned here, merely in a representative capacity, for the preparation of the rubber fraction of the elastomers are acrylates, such as n-butyl acrylate and 2-ethylhexyl acrylate, corresponding methacrylates, butadiene and isoprene, and also mixtures of these. These monomers may be copolymerized with other monomers, such as styrene, acrylonitrile, vinyl ethers and with other acrylates or methacrylates, such as methyl methacrylate, methyl acrylate, ethyl acrylate or propyl acrylate.

The soft or rubber phase (with a glass transition temperature of below 0° C.) of the elastomers may be the core, the outer envelope or an intermediate shell (in the case of elastomers whose structure has more than two shells). Elastomers having more than one shell may also have two or more shells composed of a rubber phase.

If one or more hard components (with glass transition temperatures above 20° C.) are involved, besides the rubber phase, in the structure of the elastomer, these are generally prepared by polymerizing, as principal monomers, styrene, acrylonitrile, methacrylonitrile, α-methylstyrene, p-methylstyrene, or acrylates or methacrylates, such as methyl acrylate, ethyl acrylate or methyl methacrylate. Besides these, it is also possible to use relatively small proportions of other comonomers.

It has proven advantageous in some cases to use emulsion polymers which have reactive groups at their surfaces. Examples of groups of this type are epoxy, carboxy, latent carboxy, amino and amide groups, and also functional groups which may be introduced by concomitant use of monomers of the general formula

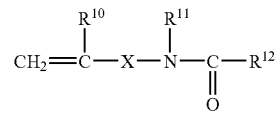

where:
$R^{10}$ is hydrogen or $C_1$-$C_4$-alkyl,
$R^{11}$ is hydrogen or $C_1$-$C_8$-alkyl or aryl, in particular phenyl,
$R^{12}$ is hydrogen, $C_1$-$C_{10}$-alkyl, $C_6$-$C_{12}$-aryl or —$OR^{13}$
$R^{13}$ is $C_1$-$C_8$-alkyl or $C_6$-$C_{12}$-aryl, optionally substituted by O- or N-comprising groups,
X is a chemical bond or $C_1$-$C_{10}$-alkylene or $C_6$-$C_{12}$-arylene, or

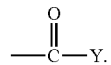

Y is O—Z or NH—Z, and
Z is $C_1$-$C_{10}$-alkylene or $C_6$-$C_{12}$-arylene.

The graft monomers described in EP-A 208 187 are also suitable for introducing reactive groups at the surface.

Other examples which may be mentioned are acrylamide, methacrylamide and substituted acrylates or methacrylates, such as (N-tert-butylamino)ethyl methacrylate, (N,N-dimethylamino)ethyl acrylate, (N,N-dimethylamino)methyl acrylate and (N,N-diethylamino)ethyl acrylate.

The particles of the rubber phase may also have been crosslinked. Examples of crosslinking monomers are 1,3-butadiene, divinylbenzene, diallyl phthalate and dihydrodicyclopentadienyl acrylate, and also the compounds described in EP-A 50 265.

It is also possible to use the monomers known as graft-linking monomers, i.e. monomers having two or more polymerizable double bonds which react at different rates during the polymerization. Preference is given to the use of compounds of this type in which at least one reactive group polymerizes at about the same rate as the other monomers, while the other reactive group (or reactive groups), for example, polymerize(s) significantly more slowly. The different polymerization rates give rise to a certain proportion of double-bond unsaturation in the rubber. If another phase is then grafted onto a rubber of this type, at least some of the double bonds present in the rubber react with the graft monomers to form chemical bonds, i.e. the phase grafted on has at least some degree of chemical bonding to the graft base.

Examples of graft-linking monomers of this type are monomers comprising allyl groups, in particular allyl esters of ethylenically unsaturated carboxylic acids, for example allyl acrylate, allyl methacrylate, diallyl maleate, diallyl fumarate and diallyl itaconate, and the corresponding monoallyl compounds of these dicarboxylic acids. Besides these there is a wide variety of other suitable graft-linking monomers. For further details reference may be made here, for example, to U.S. Pat. No. 4,148,846.

The proportion of these crosslinking monomers in the impact-modifying polymer is generally up to 5% by weight, preferably not more than 3% by weight, based on the impact-modifying polymer.

Some preferred emulsion polymers are listed below. Mention may first be made here of graft polymers with a core and with at least one outer-shell, and having the following structure:

| Type | Monomers for the core | Monomers for the envelope |
|---|---|---|
| I | 1,3-butadiene, isoprene, n-butyl acrylate, ethylhexyl acrylate, or a mixture of these | styrene, acrylonitrile, methyl methacrylate |
| II | as I, but with concomitant use of crosslinking agents | as I |
| III | as I or II | n-butyl acrylate, ethyl acrylate, methyl acrylate, 1,3-butadiene, isoprene, ethylhexyl acrylate |
| IV | as I or II | as I or III, but with concomitant use of monomers having reactive groups, as described herein |
| V | styrene, acrylonitrile, methyl methacrylate, or a mixture of these | first envelope composed of monomers as described under I and II for the core, second envelope as described under I or IV for the envelope |

These graft polymers, in particular ABS polymers and/or ASA polymers, are preferably used in amounts of up to 40% by weight for the impact-modification of PBT, if appropriate in a mixture with up to 40% by weight of polyethylene terephthalate. Blend products of this type are obtainable with the trademark Ultradur®S (previously Ultrablend®S from BASF AG).

Instead of graft polymers whose structure has more than one shell, it is also possible to use homogeneous, i.e. single-shell, elastomers composed of 1,3-butadiene, isoprene and n-butyl acrylate or of copolymers of these. These products, too, may be prepared by concomitant use of crosslinking monomers or of monomers having reactive groups.

Examples of preferred emulsion polymers are n-butyl acrylate-(meth)acrylic acid copolymers, n-butyl acrylate-glycidyl acrylate or n-butyl acrylate-glycidyl methacrylate copolymers, graft polymers with an inner core composed of n-butyl acrylate or based on butadiene and with an outer envelope composed of the above-mentioned copolymers, and copolymers of ethylene with comonomers which supply reactive groups.

The elastomers described may also be prepared by other conventional processes, e.g. by suspension polymerization.

Preference is also given to silicone rubbers, as described in DE-A 37 25 576, EP-A 235 690, DE-A 38 00 603 and EP-A 319 290.

It is, of course, also possible to use mixtures of the types of rubber listed above.

Fibrous or particulate fillers C) which may be mentioned are carbon fibers, glass fibers, glass beads, amorphous silica, asbestos, calcium silicate, calcium metasilicate, magnesium carbonate, kaolin, chalk, powdered quartz, mica, barium sulfate and feldspar, used in amounts of up to 50% by weight, in particular up to 40%.

Preferred fibrous fillers which may be mentioned are carbon fibers, aramid fibers and potassium titanate fibers, and particular preference is given to glass fibers in the form of E glass. These may be used as rovings or in the commercially available forms of chopped glass.

Mixtures of glass fibers C) with component B) in a ratio of from 1:100 to 1:2 and preferably of from 1:10 to 1:3 are particularly preferred.

The fibrous fillers may have been surface-pretreated with a silane compound to improve compatibility with the thermoplastic.

Suitable silane compounds have the general formula:

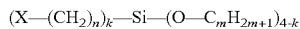

where:

X is $NH_2-$,

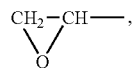

$HO-$, n is a whole number from 2 to 10, preferably 3 to 4,
m is a whole number from 1 to 5, preferably 1 to 2, and
k is a whole number from 1 to 3, preferably 1.

Preferred silane compounds are aminopropyltrimethoxysilane, aminobutyltrimethoxysilane, aminopropyltriethoxysilane and aminobutyltriethoxysilane, and also the corresponding silanes which comprise a glycidyl group as substituent X.

The amounts of the silane compounds generally used for surface-coating are from 0.05 to 5% by weight, preferably from 0.5 to 1.5% by weight and in particular from 0.8 to 1% by weight (based on C).

Acicular mineral fillers are also suitable.

For the purposes of the invention, acicular mineral fillers are mineral fillers with strongly developed acicular character. An example is acicular wollastonite. The mineral preferably has an L/D (length to diameter) ratio of from 8:1 to 35:1, preferably from 8:1 to 11:1. The mineral filler may, if appropriate, have been pretreated with the abovementioned silane compounds, but the pretreatment is not essential.

Other fillers which may be mentioned are kaolin, calcined kaolin, wollastonite, talc and chalk.

As component C), the thermoplastic molding compositions of the invention may comprise the usual processing aids, such as stabilizers, oxidation retarders, agents to counteract decomposition due to heat and decomposition due to ultraviolet light, lubricants and mold-release agents, colorants, such as dyes and pigments, nucleating agents, plasticizers, etc.

Examples which may be mentioned of oxidation retarders and heat stabilizers are sterically hindered phenols and/or phosphites, hydroquinones, aromatic secondary amines, such as diphenylamines, various substituted members of these groups, and mixtures of these in concentrations of up to 1% by weight, based on the weight of the thermoplastic molding compositions.

UV stabilizers which may be mentioned, and are generally used in amounts of up to 2% by weight, based on the molding composition, are various substituted resorcinols, salicylates, benzotriazoles, and benzophenones.

Colorants which may be added are inorganic pigments, such as titanium dioxide, ultramarine blue, iron oxide, and carbon black, and also organic pigments, such as phthalocyanines, quinacridones and perylenes, and also dyes, such as nigrosine and anthraquinones.

Nucleating agents which may be used are sodium phenylphosphinate, alumina, silica, and preferably talc.

Other lubricants and mold-release agents are usually used in amounts of up to 1% by weight. Preference is given to long-chain fatty acids (e.g. stearic acid or behenic acid), salts of these (e.g. calcium stearate or zinc stearate) or montan waxes (mixtures of straight-chain saturated carboxylic acids having chain lengths of from 28 to 32 carbon atoms), or calcium montanate or sodium montanate, or low-molecular-weight polyethylene waxes or low-molecular-weight polypropylene waxes.

Examples of plasticizers which may be mentioned are dioctyl phthalates, dibenzyl phthalates, butyl benzyl phthalates, hydrocarbon oils and N-(n-butyl)benzene-sulfonamide.

The inventive molding compositions may also comprise from 0 to 2% by weight of fluorine-comprising ethylene polymers. These are polymers of ethylene with a fluorine content of from 55 to 76% by weight, preferably from 70 to 76% by weight.

Examples of these are polytetrafluoroethylene (PTFE), tetrafluoroethylene-hexafluoropropylene copolymers and tetrafluoroethylene copolymers with relatively small proportions (generally up to 50% by weight) of copolymerizable ethylenically unsaturated monomers. These are described, for example, by Schildknecht in "Vinyl and Related Polymers", Wiley-Verlag, 1952, pages 484-494 and by Wall in "Fluoropolymers" (Wiley Interscience, 1972).

These fluorine-comprising ethylene polymers have homogeneous distribution in the molding compositions and preferably have a particle size $d_{50}$ (numeric average) in the range from 0.05 to 10 μm, in particular from 0.1 to 5 μm. These small particle sizes can particularly preferably be achieved by the use of aqueous dispersions of fluorine-comprising ethylene polymers and the incorporation of these into a polyester melt.

The inventive thermoplastic molding compositions may be prepared by methods known per se, by mixing the starting components in conventional mixing apparatus, such as screw extruders, Brabender mixers or Banbury mixers, and then extruding them. The extrudate may be cooled and comminuted. It is also possible to premix individual components and then to add the remaining starting materials individually and/or likewise in a mixture. The mixing temperatures are generally from 230 to 290° C.

In another preferred procedure, components B), and also, if appropriate, C) can be mixed with a polyester prepolymer, compounded, and pelletized. The resultant pellets are solid-phase-condensed under an inert gas continuously or batchwise at a temperature below the melting point of component A) until the desired viscosity has been reached.

It is important for the inventive process that the hyperbranched additive B1 and/or B2 is used to improve adhesion in multicomponent moldings. For the purposes of the invention, this means that at least 2 layers, preferably from 2 to 5 layers, are present, and at least one layer here is composed of the polyester composition according to claim 1, and at least one other layer is composed of metal, lacquer, or adhesive, or else of other coating compositions, and these should have direct contact with the polyester layer. The structure of the multicomponent molding here can have layers mutually super-posed or else have what is known as a tapered transition of the layers.

Suitable metal layers which may be mentioned are those composed of gold, silver, platinum, chromium, aluminum, copper, titatnium, nickel, tin, and zinc, or their mixtures.

For the metallizing process, a pretreatment can be necessary, for example via swelling, plasma activation, etching, sputtering (magnetic sputtering), etch, and then metallizing in particular by means of PVD or CVD.

Alongside the deposition of metallic layers in reactive dip-bath processes using a chemical or electroplating method, alternative thin-layer processes have been developed for direct metallization of plastics. The coating materials here are converted to the gas phase in vacuo or in a defined gas atmosphere, and they condense on the surface of the component. A distinction is made between physical deposition processes (PVD=physical vapor deposition) and chemical deposition processes (CVD=chemical vapor deposition), as a function of the starting substance prior to the gas phase.

PVD processes are often used for metallizing of plastics, since the temperature is lower and process control is simpler. PVD processes are not only environmentally friendly but also provide better flexibility and with this a wider application range than chemical-electroplating processes. On the other hand, more complicated plant technology is required because process pressures are lower.

A distinction is made in principle between two PVD processes. Firstly, the lower cost vapor deposition variant in which heat is supplied in order to vaporize metal. A second process, used on a large industrial scale, is sputtering of substrate material with the aid of an ionized process gas. In this process, a process gas (mostly argon) is ionized in the gas phase and accelerated (magnetron sputtering) via a magnetic field onto the material (target) for deposition. Atoms and atom clusters are driven out from the target via impact of the ionized gas atoms and deposit on the substrates in vacuum receivers.

PVD metallizing of polymers is used in many sectors, for example for decorative and reflective coatings. However, the technology is also used for electronics applications, for example for electromagnetic screening layers in electronic consumer articles.

Relatively recent developments concern selective metallizing of plastics components, this being of interest for electromechanical components and for what are known as molded interconnected devices (3D-MID). Here, the thin-layer process is used for the coating of polymers whose long-term service temperature is up to 260° C. and which are difficult to metallize.

Another possible application consists in the good barrier action of metallized materials. For example, a metallic layer can restrict diffusion phenomena in plastics containers.

Metallized moldings are used as described in the introduction (p. 1) and also as described above.

In another preferred embodiment of the present invention, the inventive polyester molding compositions can exhibit improved adhesion to lacquers, for example to clear lacquers and opaque lacquers, for example in coating compositions, if appropriate together with other binders having hydroxy or amino groups, e.g. with hydroxy (meth)acrylates, with hydroxystyryl (meth)acrylates, with linear or branched polyesters, with polyethers, with polycarbonates, with melamine resins, or with urea-formaldehyde resins, together with compounds reactive toward carboxy and/or hydroxy functions. By way of example, these binders can be crosslinked using isocyanates, using capped isocyanates, using epoxides and/or aminoplastics, preferably using isocyanates, using epoxides, or using aminoplastics, particularly preferably using isocyanates or using epoxides, and very particularly preferably using isocyanates.

Examples of isocyanates are aliphatic, aromatic and cycloaliphatic di- and polyisocyanates whose average NCO functionality is at least 1.8, preferably from 1.8 to 5, and particularly preferably from 2 to 4, and also their isocyanurates, oxadiazinetriones, iminooxadiazinediones, ureas, biurets, amides, urethanes, allophanates, carbodiimides, uretoneimines, and uretdiones.

The diisocyanates are preferably isocyanates having 4 to 20 carbon atoms. Examples of customary diisocyanates are aliphatic diisocyanates such as tetramethylene diisocyanate, hexamethylene diisocyanate (1,6-diisocyanatohexane), octamethylene diisocyanate, decamethylene diisocyanate, dodecamethylene diisocyanate, tetradecamethylene diisocyanate, lysine diisocyanate derivatives, trimethylhexane diisocyanate or tetramethylhexane diisocyanate, cycloaliphatic diisocyanates such as 1,4-, 1,3- or 1,2-diisocyanatocyclohexane, 4,4'- or 2,4'-di(isocyanatocyclohexyl)methane, 1-isocyanato-3,3,5-trimethyl-5-(isocyanatomethyl)cyclohexane (isophorone diisocyanate), 1,3- or 1,4-bis(isocyanatomethyl) cyclohexane or 2,4- or 2,6-diisocyanato-1-methylcyclohexane, and aromatic diisocyanates such as 2,4- or 2,6-tolylene diisocyanate and the isomer mixtures thereof m- or p-xylylene diisocyanate, 2,4'- or 4,4'-diisocyanatodiphenyl-methane and the isomer mixtures thereof, 1,3- or 1,4-phenylene diisocyanate, 1-chloro-2,4-phenylene diisocyanate, 1,5-naphthylene diisocyanate, diphenylene 4,4'-diisocyanate, 4,4'-diisocyanato-3,3'-dimethylbiphenyl, 3-methyldiphenyl-methane 4,4'-diisocyanate, tetramethylxylylene diisocyanate, 1,4-diisocyanatobenzene or diphenyl ether 4,4'-diisocyanate.

Mixtures of said diisocyanates may also be present.

Polyisocyanates which may be used are polyisocyanates comprising isocyanurate groups, uretdione diisocyanates, polyisocyanates having biuret groups, polyisocyanates having amide groups, polyisocyanates having urethane groups or having allophanate groups, polyisocyanates comprising oxadiazinetrione groups or comprising iminooxadiazinedione groups, polyisocyanates modified by carbodiimide or by uretoneimine and derived from straight-chain or branched $C_4$-$C_{20}$-alkylene diisocyanates, or derived from cycloaliphatic diisocyanates having a total of from 6 to 20 carbon atoms, or derived from aromatic diisocyanates having a total of from 8 to 20 carbon atoms, and mixtures of these may also be used.

The diisocyanates and polyisocyanates which can be used preferably have an isocyanate group content (calculated as NCO, molecular weight=42) of from 1 to 60% by weight, based on the diisocyanate and polyisocyanate (mixture), preferably from 2 to 60% by weight, and very preferably from 10 to 55% by weight.

Preference is given to aliphatic and/or cycloaliphatic diisocyanates and polyisocyanates, examples being the abovementioned aliphatic and cycloaliphatic diisocyanates, and mixtures thereof.

Particular preference is given to hexamethylene diisocyanate, 1,3-bis(isocyanatomethyl)cyclohexane, isophorone diisocyanate and di(isocyanatocyclohexyl)methane, very particular preference to isophorone diisocyanate and hexamethylene diisocyanate, and especial preference to hexamethylene diisocyanate.

Further preference is given to
1) Polyisocyanates comprising isocyanurate groups and formed from aromatic, aliphatic and/or cycloaliphatic diisocyanates. Particular preference is given here to the corresponding aliphatic and/or cycloaliphatic isocyanato-isocyanurates and, in particular, to those based on hexamethylene diisocyanate and isophorone diisocyanate. The isocyanurates present are, in particular, trisisocyanatoalkyl or trisisocyanatocycloalkyl isocyanurates, which represent cyclic trimers of the diisocyanates, or are mixtures with their higher homologs comprising more than one isocyanurate ring. The isocyanato-isocyanurates generally have an NCO content of from 10 to 30% by weight, in particular from 15 to 25% by weight, and an average NCO functionality of from 2.6 to 4.5.
2) Uretdione diisocyanates having aromatically, aliphatically and/or cycloaliphatically attached isocyanate groups, preferably aliphatically and/or cycloaliphatically attached isocyanate groups, and especially those derived from hexamethylene diisocyanate or isophorone diisocyanate. Uretdione diisocyanates are cyclic dimerization products of diisocyanates.
The uretdione diisocyanates can be used as sole component in the inventive formulations or in a mixture with other polyisocyanates, especially those specified under 1).
3) Polyisocyanates comprising biuret groups and having aromatically, cycloaliphatically or aliphatically attached, preferably cycloaliphatically or aliphatically attached, isocyanate groups, especially tris(6-isocyanatohexyl)biuret or its mixtures with its higher homologs. These polyisocyanates comprising biuret groups generally have an NCO content of from 18 to 23% by weight and an average NCO functionality of from 2.8 to 4.5.
4) Polyisocyanates comprising urethane and/or allophanate groups and having aromatically, aliphatically or cycloaliphatically attached, preferably aliphatically or cycloaliphatically attached, isocyanate groups, as obtainable for example by reacting excess amounts of hexamethylene diisocyanate or of isophorone diisocyanate with mono- or polyhydric alcohols, e.g. methanol, ethanol, isopropanol, n-propanol, n-butanol, isobutanol, sec-butanol, tert-butanol, n-pentanol, n-hexanol, n-heptanol, n-octanol, n-decanol, n-dodecanol (lauryl alcohol), 2-ethylhexanol, stearyl alcohol, cetyl alcohol, lauryl alcohol, ethylene glycol monomethyl ether, ethylene glycol monoethyl ether, 1,3-propanediol monomethyl ether, cyclopentanol, cyclohexanol, cyclooctanol, cyclododecanol, or polyhydric alcohols as listed above for the polyesterols, or mixtures of these. These polyisocyanates comprising urethane and/or allophanate groups generally have an NCO content of from 12 to 20% by weight and an average NCO functionality of from 2.5 to 4.5.
5) Polyisocyanates comprising oxadiazinetrione groups, preferably derived from hexamethylene diisocyanate or isophorone diisocyanate. Polyisocyanates of this kind comprising oxadiazinetrione groups can be prepared from diisocyanate and carbon dioxide.
6) Polyisocyanates comprising iminooxadiazinedione groups, and preferably derived from hexamethylene diisocyanate or from isophorone diisocyanate. These polyisocyanates comprising iminooxadiazinedione groups can be prepared from diisocyanates by means of specific catalysts.
7) Carbodiimide- and/or uretoneimine-modified polyisocyanates.

The polyisocyanates 1) to 7) can be used in a mixture, including if appropriate in a mixture with diisocyanates.

The isocyanate groups of the di- or polyisocyanates can also be present in capped form. Examples of suitable capping agents for NCO groups are oximes, phenols, imidazoles, pyrazoles, pyrazolinones, triazoles, diketopiperazines, caprolactam, malonic esters, or the compounds mentioned in the publications by Z. W. Wicks, Prog. Org. Coat. 3 (1975) 73-99 and Prog. Org. Coat 9 (1981), 3-28, by D. A. Wicks and Z. W. Wicks, Prog. Org. Coat. 36 (1999), 148-172 and Prog. Org. Coat. 41 (2001), 1-83, and also in Houben-Weyl, Methoden der Organischen Chemie [Methods of organic chemistry], Vol. XIV/2, 61 et seq., Georg Thieme Verlag, Stuttgart 1963.

Capping agents or blocking agents here mean compounds which convert isocyanate groups into blocked (capped or protected) isocyanate groups, which then below what is known as the deblocking temperature do not exhibit the usual reactions of a free isocyanate group. These compounds having blocked isocyanate groups are usually used in dual-cure coating compositions or in powder coatings which undergo final hardening by way of isocyanate group curing.

Epoxy compounds are those having at least one, preferably having at least two, particularly preferably having two to ten, epoxy groups in the molecule.

Examples of those which may be used are epoxidized olefins, glycidyl esters (e.g. glycidyl (meth)acrylate) of saturated or unsaturated carboxylic acids, or glycidyl ethers of aliphatic or aromatic polyols. Large numbers of products of this type are available commercially. Particular preference is given to polyglycidyl compounds of bisphenol A type, of bisphenol F type, or of bisphenol B type, and to glycidyl ethers of polyhydric alcohols, e.g. of butanediol, of 1,6-hexanediol, of glycerol, and of pentaerythritol. Examples of these polyepoxy compounds are Epikote® 812 (epoxy number: about 0.67 mol/100 g) and Epikote® 828 (epoxy number: about 0.53 mol/100 g), Epikote® 1001, Epikote® 1007 and Epikote® 162 (epoxy number: about 0.61 mol/100 g) from Resolution, Rütapox® 0162 (epoxy number: about 0.58 mol/100 g), Rütapox® 0164 (epoxy number: about 0.53 mol/100 g) and Rütapox® 0165 (epoxy number: about 0.48 mol/100 g) from Bakelite AG, Araldit® DY 0397 (epoxy number: about 0.83 mol/100 g) from Vantico AG.

It is also possible to use compounds having active methylol or active alkylalkoxy groups, in particular methylalkoxy groups, examples being etherified reaction products of formaldehyde with amines, such as melamine, urea, etc., and other examples being phenol-formaldehyde adducts, siloxane or silane groups and anhydrides, for example those described in U.S. Pat. No. 5,770,650.

Among the known, preferred aminoplastics widely used industrially, those which may be used with particular preference are urea resins and melamine resins, e.g. urea-formaldehyde resins, melamine-formaldehyde resins, melamine-phenol-formaldehyde resins, or melamine-urea-formaldehyde resins.

Suitable urea resins are those which are obtainable via reaction of ureas with aldehydes and which can, if appropriate, be modified.

Suitable ureas are urea, N-substituted ureas or N,N'-disubstituted ureas, e.g. N-methylurea, N-phenylurea, N,N'-dimethylurea, hexamethylenediurea, N,N'-diphenylurea, 1,2-ethylenediurea, 1,3-propylenediurea, diethylenetriurea, dipropylenetriurea, 2-hydroxypropylenediurea, 2-imidazolidinone (ethyleneurea), 2-oxohexahydro-pyrimidine (propyleneurea), or 2-oxo-5-hydroxyhexahydropyrimidine (5-hydroxy-propyleneurea).

Urea resins may, if appropriate, be partially or completely modified, e.g. via reaction with mono- or polyhydric alcohols, with ammonia or, respectively, amines (cationically modified urea resins), or with (hydrogen)sulfites (anionically modified urea resins), and the alcohol-modified urea resins are particularly suitable.

Alcohols which may be used for the modification process are $C_1$-$C_6$ alcohols, preferably $C_1$-$C_4$ alcohol, and in particular methanol, ethanol, isopropanol, n-propanol, n-butanol, isobutanol, and sec-butanol.

Suitable melamine resins are those which are obtainable via reaction of melamine with aldehydes, and which, if appropriate, can be partially or completely modified. Particularly suitable aldehydes are formaldehyde, acetaldehyde, isobutyraldehyde, and glyoxal.

Melamine-formaldehyde resins are reaction products of the reaction of melamine with aldehydes, e.g. with the abovementioned aldehydes, in particular formaldehyde. If appropriate, the methylol groups obtained are modified via etherification using the abovementioned mono- or polyhydric alcohols. The melamine-formaldehyde resins may moreover also be modified as described above via reaction with amines, with amino-carboxylic acids, or with sulfites.

According to the invention, action of formaldehyde on mixtures of melamine and urea or on mixtures composed of melamine and phenol likewise produces melamine-urea-formaldehyde resins and, respectively, melamine-phenol-formaldehyde resins that can be used.

The aminoplastics mentioned are prepared by processes known per se.

Particular examples mentioned are melamine-formaldehyde resins, including monomeric or polymeric melamine resins and partially or completely alkylated melamine resins, urea resins, e.g. methylolureas, such as formaldehyde-urea resins, alkoxy-ureas, such as butylated formaldehyde-urea resins, and also N-methylolacrylamide emulsions, isobutoxymethylacrylamide emulsions, polyanhydrides, e.g. polysuccinic an hydride, and siloxanes or silanes, e.g. dimethyldimethoxysilanes.

Particular preference is given to aminoplastic resins such as melamine-formaldehyde resins or formaldehyde-urea resins.

The lacquers or coatings can be conventional base lacquers, water-based lacquers, substantially solvent- and water-free liquid base lacquers (100% systems), substantially solvent- and water-free solid base lacquers (powder coatings and pigmented powder coatings), or substantially solvent-free, if appropriate pigmented, powder-coating dispersions (powder slurry base lacquers). They can be capable of curing by thermal, radiative, or dual cure processes, and can be inherently or non-inherently crosslinking.

The usual coating method is a coating method known per se, and then the materials are dried to remove solvent present, if appropriate, and cured.

Conventional processes known to the person skilled in the art are used for the coating of the polyester layer, at least one inventive coating composition being applied at the desired thickness to the substrate to be coated, and the volatile constituents being removed. This procedure can, if desired, be repeated one or more times. The polyester layer can be applied in a manner known per se, e.g. through a nozzle, or by trowelling, doctoring, brushing, roller-coating, roll-coating, or casting. The coating thickness is generally in the range from about 3 to 1000 $g/m^2$, preferably from 10 to 200 $g/m^2$.

Particular applications which may be mentioned are:

Lacquering of motor-vehicle-exterior parts, of external or internal moldings, of household devices or of parts of devices, or of parts of casings, or else protective lacquering for metallic moldings.

EXAMPLES

Component A

Polybutylene terephthalate with a viscosity number VN of 130 ml/g and having a carboxy end group content of 34 meq/kg (Ultradur® B 4520 from BASF AG) (VN measured in 0.5% strength by weight solution composed of phenol/o-dichlorobenzene), 1:1 mixture at 25° C., comprising 0.65% by weight of pentaerythritol tetrastearate (component C1, based on 100% by weight of A)

Preparation Specification for Polycarbonate B1

General Operating Specification:

An equimolar mixture of the polyhydric alcohol with diethyl carbonate was prepared according to Table 1 in a three-necked flask equipped with stirrer, reflux condenser, and internal thermometer, and 250 ppm of catalyst (based on the amount of alcohol) were added. The mixture was then heated to 100° C. with stirring, and in the case of the experiment indicated by * heated to 140° C., and stirred at this temperature for 2 h. As the reaction time progressed, the temperature of the reaction mixture decreased here as a result of the onset of evaporative cooling by the monoalcohol liberated. The reflux condenser was then replaced with an inclined condenser, ethanol was removed by distillation, and the temperature of the reaction mixture was increased slowly as far as 160° C.

The ethanol removed by distillation was collected in a cooled round-bottomed flask and weighed, and conversion was thus determined as a percentage, based on the complete conversion theoretically possible (see Table 1).

The reaction products were then analyzed by gel permeation chromatography, the eluant being dimethylacetamide, and the standard used being polymethyl methacrylate (PMMA).

TABLE 1

| Alcohol | Catalyst | Amount of ethanol distillate, based on complete conversion [mol %] | Molecular weight $M_w$ $M_n$ | Visc. 23° C. [m Pas] | OH number [mg KOH/g] |
|---|---|---|---|---|---|
| TMP × 1.2 PO | $K_2CO_3$ | 90 | 1836 1292 | 7150 | 455 |

TMP ≙ trimethylolpropane
PO ≙ propylene oxide

Preparation of Molding Compositions

Components A) to C) were blended in a twin-screw extruder at from 250 to 260° C. and extruded into a water bath. After pelletization and drying, test specimens were injection molded and tested.

To test surface adhesion, dumbbell specimens were produced to ISO 527-2 and metallized. Metallizing method was vapor deposition of Cu (physical vapor deposition, PVD): "Meta 1100 Arc" Horizontal Vapor Deposition System 1100 $dm^3$ chamber volume, component dimensions up to 1000 mm length and 200 mm diameter. Test specimen: tensile specimens to ISO 527-2.

The parts to be coated were secured in the vacuum chamber on a rotating cage and rotated around the vaporizer unit during the vapor deposition process.

Once the vacuum chamber had been sealed, the system was evacuated to a pressure of about $1\times10^{-4}$ mbar. The Cu metal was vaporized using resistant-heated sources (coils/boats).

As a function of the application, the typical layer thickness is from 50 nanometers (0.00005 mm) to a few micrometers, e.g. in the case of electromagnetic screening layers (EMC).

Adhesion of the metal to the plastics surface was then determined in a peel test to DIN EN 60249. 20 repeat measurements of peel resistance were made using a metallized rod, and the average peel strength was compared:

In each case here, copper strips were peeled at the angle and 90° on the test specimens. The peel rate for peeling of the copper strips was 50 mm/min over a length of at least 25 mm. The peel force F was recorded as a function of the displacement X.

| | |
|---|---|
| Specimen 1: | Component A) + 1% by weight of B1 |
| Specimen 2: | Component A) without B1 (for comparison) |

The results of the tests are found in Tables 2 and 3.

TABLE 2

Peel test for specimen 1, 20 repeats with average and standard deviation

| Specimen 1 | Peer strength (N/mm) | Fmax (N) | Fmin (N) | Stadev (N) | Variance (N) | Length (mm) |
|---|---|---|---|---|---|---|
| P1-1 | 0.76 | 1.10 | 0.04 | 0.23 | 0.16 | 77.32 |
| P1-2 | 1.01 | 1.42 | 0.03 | 0.27 | 0.22 | 78.77 |
| P1-3 | 1.15 | 1.44 | 0.81 | 0.11 | 0.03 | 53.97 |
| P1-4 | 0.65 | 1.40 | 0.41 | 0.29 | 0.26 | 63.25 |
| P1-5 | 0.66 | 1.11 | 0.42 | 0.14 | 0.06 | 36.15 |
| P1-6 | 0.70 | 1.27 | 0.18 | 0.28 | 0.23 | 62.27 |
| P1-7 | 0.86 | 1.21 | 0.41 | 0.09 | 0.03 | 64.17 |
| P1-8 | 1.53 | 2.16 | 1.01 | 0.23 | 0.16 | 42.27 |
| P1-9 | 1.00 | 1.43 | 0.02 | 0.23 | 0.15 | 78.10 |
| P1-10 | 1.18 | 1.65 | 0.62 | 0.18 | 0.10 | 52.63 |
| P1-11 | 1.00 | 1.25 | 0.78 | 0.09 | 0.03 | 74.90 |
| P1-12 | 1.29 | 1.79 | 0.95 | 0.14 | 0.06 | 72.13 |
| P1-13 | 1.04 | 1.53 | 0.74 | 0.17 | 0.08 | 74.50 |
| P1-14 | 1.17 | 1.87 | 0.44 | 0.26 | 0.20 | 55.23 |
| P1-15 | 1.18 | 1.45 | 0.78 | 0.14 | 0.06 | 48.18 |
| P1-16 | 0.87 | 1.70 | 0.17 | 0.45 | 0.61 | 70.33 |
| P1-17 | 0.96 | 1.41 | 0.47 | 0.15 | 0.07 | 69.53 |
| P1-18 | 1.47 | 2.30 | 0.93 | 0.25 | 0.19 | 45.57 |
| P1-19 | 1.30 | 1.84 | 0.98 | 0.15 | 0.07 | 70.88 |
| P1-20 | 1.03 | 1.93 | 0.30 | 0.36 | 0.39 | 42.75 |
| Average | 1.04 | 1.56 | 0.51 | 0.21 | 0.16 | |

TABLE 3

Peel test for specimen 2, 20 repeats with average and standard deviation

| Specimen 2 | Peel strength (N/mm) | Fmax (N) | Fmin (N) | Stadev (N) | Variance (N) | Length (mm) |
|---|---|---|---|---|---|---|
| P2-1 | 0.45 | 0.69 | 0.23 | 0.12 | 0.04 | 55.87 |
| P2-2 | 0.73 | 1.75 | 0.17 | 0.35 | 0.37 | 66.78 |
| P2-3 | 0.69 | 0.92 | 0.50 | 0.08 | 0.02 | 58.58 |
| P2-4 | 0.84 | 1.53 | 0.35 | 0.26 | 0.20 | 62.47 |
| P2-5 | 0.62 | 0.87 | 0.30 | 0.11 | 0.03 | 66.97 |
| P2-6 | 0.78 | 1.66 | 0.19 | 0.34 | 0.34 | 65.23 |
| P2-7 | 0.56 | 0.93 | 0.25 | 0.12 | 0.04 | 63.42 |
| P2-8 | 0.23 | 0.56 | 0.08 | 0.10 | 0.03 | 54.90 |
| P2-9 | 0.64 | 0.95 | 0.46 | 0.10 | 0.03 | 67.80 |
| P2-10 | 0.94 | 1.41 | 0.31 | 0.23 | 0.16 | 59.70 |
| P2-11 | 0.45 | 0.73 | 0.26 | 0.10 | 0.03 | 77.85 |
| P2-12 | 1.13 | 1.58 | 0.55 | 0.19 | 0.11 | 72.15 |
| P2-13 | 1.42 | 1.94 | 0.81 | 0.25 | 0.19 | 78.42 |
| P2-14 | 0.98 | 1.44 | 0.64 | 0.17 | 0.09 | 28.72 |
| P2-15 | 0.52 | 0.80 | 0.34 | 0.09 | 0.03 | 77.88 |
| P2-16 | 0.78 | 1.34 | 0.22 | 0.27 | 0.22 | 58.05 |
| P2-17 | 0.76 | 1.11 | 0.52 | 0.11 | 0.04 | 59.77 |
| P2-18 | 0.81 | 1.40 | 0.25 | 0.24 | 0.17 | 48.47 |
| P2-19 | 0.60 | 0.91 | 0.40 | 0.10 | 0.03 | 67.57 |
| P2-20 | 1.21 | 1.93 | 0.64 | 0.23 | 0.15 | 66.98 |
| Average | 0.76 | 1.22 | 0.37 | 0.18 | 0.12 | |

We claim:

1. A process for production of multicomponent moldings comprising at least one metal layer and at least one polyester layer, which comprises producing a molding of which the at least one polyester layer is composed of a thermoplastic molding composition composed of
- A) from 10 to 99.99% by weight of at least one thermoplastic polyester,
- B) from 0.01 to 20% by weight of
  - B1) at least one hyperbranched polycarbonate having an OH number of from 1 to 600 mg KOH/g of polycarbonate (DIN 53240, Part 2), having a glass transition temperature Tg from −80° C. to 140° C., a degree of branching from 10 to 99.9%, and both structural and molecular non-uniformity,
  - or
  - B2) at least one hyperbranched polyester of $A_xB_y$ type, where x is at least 1.1 and y is at least 2.1, having a glass transition temperature from −50° C. to 140° C., a degree of branching from 10 to 99.9%, and both structural and molecular non-uniformity, or a mixture of these, and
- C) from 0 to 60% by weight of other additives, where the total of the percentages by weight of components A) to C) is 100%, and wherein the polyester layer exhibits improved adhesion to the at least one metal layer compared to a polyester layer which does not comprise component B) when measured according to DIN EN 60249.20.

2. The process according to claim 1, wherein component B1) has a number-average molar mass $M_n$ of from 100 to 15 000 g/mol.

3. The process according to claim 1, wherein component B1) has a viscosity (mPas) at 23° C. (DIN 53019) of from 50 to 200 000.

4. The process according to claim 1, wherein component B2) has an OH number (DIN 53240) of from 0 to 600 mg KOH/g of polyester.

5. The process according to claim 1, wherein component B2) has a COOH number (DIN 53240) of from 0 to 600 mg KOH/g of polyester.

6. The process according to claim 1, wherein component B2) has at least one OH number or COOH number greater than 0.

7. The process according to claim 1, wherein the metal layer is composed of gold, silver, platinum, chromium, aluminum, copper, titanium, nickel, tin, or zinc or a mixture of these.

8. The process as claimed in claim 1, wherein the polyester layer is metallized by means of PVD (physical vapor deposition).

9. A multicomponent molding of any type which has been metallized, and which is obtainable according to the process according to claim 1.

10. The process according to claim 2, wherein component B1) has a viscosity (mPas) at 23° C. (DIN 53019) of from 50 to 200 000.

11. The process according to claim 1, wherein component B1) has a viscosity (mPas) at 23° C. (DIN 53019) of from 50 to 200 000.

12. The process according to claim 2, wherein component B2) has an OH number (DIN 53240) of from 0 to 600 mg KOH/g of polyester.

13. The process according to claim 1, wherein component B2) has an OH number (DIN 53240) of from 0 to 600 mg KOH/g of polyester.

14. The process according to claim 3, wherein component B2) has an OH number (DIN 53240) of from 0 to 600 mg KOH/g of polyester.

15. The process according to claim 2, wherein component B2) has a COOH number (DIN 53240) of from 0 to 600 mg KOH/g of polyester.

16. The process according to claim 1, wherein component B2) has a COOH number (DIN 53240) of from 0 to 600 mg KOH/g of polyester.

17. The process according to claim 3, wherein component B2) has a COOH number (DIN 53240) of from 0 to 600 mg KOH/g of polyester.

18. The process as claimed in claim 1, wherein the polyester layer is pretreated, and is metallized by means of PVD (physical vapor deposition).

* * * * *